(12) United States Patent
Park et al.

(10) Patent No.: US 11,355,561 B2
(45) Date of Patent: Jun. 7, 2022

(54) DISPLAY DEVICE HAVING REDUCED THICKNESS, AND METHOD FOR FABRICATING THE DISPLAY DEVICE

(71) Applicant: SAMSUNG DISPLAY CO., LTD., Yongin-si (KR)

(72) Inventors: Yong Hwan Park, Cheonan-si (KR); Seong Jun Lee, Seoul (KR); Do Yeon Kim, Seoul (KR); Mi Young Kim, Daegu (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/852,860

(22) Filed: Apr. 20, 2020

(65) Prior Publication Data

US 2020/0403039 A1    Dec. 24, 2020

(30) Foreign Application Priority Data

Jun. 19, 2019   (KR) .......................... 10-2019-0072817

(51) Int. Cl.
*H01L 27/32* (2006.01)
*G06F 3/044* (2006.01)
(Continued)

(52) U.S. Cl.
CPC .......... *H01L 27/323* (2013.01); *G06F 3/0412* (2013.01); *G06F 3/0446* (2019.05);
(Continued)

(58) Field of Classification Search
CPC ............... H01L 27/323; H01L 27/3272; H01L 51/0097; H01L 51/5246; H01L 51/5253;
(Continued)

(56) References Cited

U.S. PATENT DOCUMENTS

2013/0021289 A1   1/2013  Chen et al.
2015/0185942 A1*  7/2015  Kim ...................... G06F 3/0445
                                                            345/173

(Continued)

FOREIGN PATENT DOCUMENTS

CN          107919380       4/2018
EP          3282498         2/2018
(Continued)

OTHER PUBLICATIONS

EESR Dated Nov. 12, 2020 Corresponding to European Patent Application No. EP 20178642.3.

*Primary Examiner* — David D Davis
(74) *Attorney, Agent, or Firm* — F. Chau & Associates, LLC

(57) ABSTRACT

A display device includes a display member including a substrate and a plurality of light-emitting elements disposed on the substrate, a sensing member disposed on the display member, and a polarizing member disposed on the sensing member. The sensing member includes a sensing insulating layer and a sensing conductive layer disposed on the sensing insulating layer. The polarizing member includes a polarizing layer and a polarizing adhesive layer disposed between the polarizing layer and the sensing conductive layer. The polarizing adhesive layer is in contact with the sensing conductive layer.

24 Claims, 30 Drawing Sheets

(51) Int. Cl.
*G06F 3/041* (2006.01)
*H01L 51/00* (2006.01)
*H01L 51/52* (2006.01)
*H01L 51/56* (2006.01)

(52) U.S. Cl.
CPC ...... H01L 27/3272 (2013.01); H01L 51/0097 (2013.01); H01L 51/5246 (2013.01); H01L 51/5253 (2013.01); H01L 51/5281 (2013.01); H01L 51/56 (2013.01); *G06F 2203/04102* (2013.01); *H01L 2227/323* (2013.01); *H01L 2251/5338* (2013.01)

(58) Field of Classification Search
CPC ................. H01L 51/5281; H01L 51/56; H01L 2227/323; H01L 2251/5338; H01L 27/3248; H01L 27/3262; H01L 27/322; H01L 27/3258; G06F 3/0446; G06F 3/0412; G06F 2203/04102; G06F 1/1643; Y02E 10/549
See application file for complete search history.

(56) References Cited

U.S. PATENT DOCUMENTS

| | | | | |
|---|---|---|---|---|
| 2015/0325815 | A1* | 11/2015 | Kang | H01L 51/56 257/88 |
| 2016/0087013 | A1* | 3/2016 | Kang | G06F 3/0412 257/88 |
| 2017/0097714 | A1* | 4/2017 | Lee | G02F 1/13338 |
| 2018/0046301 | A1 | 2/2018 | Zhou et al. | |
| 2018/0166652 | A1 | 6/2018 | Kim et al. | |
| 2018/0188849 | A1* | 7/2018 | Ko | H01L 27/3272 |
| 2018/0313991 | A1* | 11/2018 | Yug | B23K 26/351 |
| 2018/0321764 | A1* | 11/2018 | Oh | H01L 51/5253 |
| 2020/0294428 | A1 | 9/2020 | Kim et al. | |

FOREIGN PATENT DOCUMENTS

| | | |
|---|---|---|
| KR | 10-2018-0011919 | 2/2018 |
| KR | 10-2019-0003181 | 1/2019 |
| WO | 2019074332 | 4/2019 |

* cited by examiner

DISPLAY DEVICE HAVING REDUCED THICKNESS, AND METHOD FOR FABRICATING THE DISPLAY DEVICE

CROSS-REFERENCE TO RELATED APPLICATIONS

This application claims priority under 35 U.S.C. § 119 to Korean Patent Application No. 10-2019-0072817 filed on Jun. 19, 2019 in the Korean Intellectual Property Office, the disclosure of which is incorporated by reference herein in its entirety.

TECHNICAL FIELD

The present disclosure relates to a display device, and a method for fabricating a display device.

DISCUSSION OF THE RELATED ART

Electronic devices that provide images to a user such as, for example, a smartphone, a tablet PC, a digital camera, a laptop computer, a navigation device, a smart TV, etc., include a display device for displaying images. Such a display device includes a display panel for generating and displaying an image, as well as various input means.

A sensing member that can detect a sensing input (e.g., a touch input) may be employed in a display device used for, for example, smartphones and tablet PCs. The sensing member may be formed directly on a display panel to simplify the manufacturing process and reduce the thickness of the display device. The sensing member may include a plurality of conductive layers and a plurality of insulating layers, which insulate the conductive layers from one another. However, outside air, moisture, etc. may permeate through an exposed conductive layer of the sensing member, resulting in a failure of the sensing member.

SUMMARY

Exemplary embodiments of the present disclosure provide a display device having a thinner sensing member formed on a display panel.

Exemplary embodiments of the present disclosure also provide a method for fabricating a display device by which the number of masks used for forming a sensing member in a display panel can be reduced.

According to an exemplary embodiment of the present disclosure, a display device includes a display member including a substrate and a plurality of light-emitting elements disposed on the substrate, a sensing member disposed on the display member, and a polarizing member disposed on the sensing member. The sensing member includes a sensing insulating layer and a sensing conductive layer disposed on the sensing insulating layer. The polarizing member includes a polarizing layer and a polarizing adhesive layer disposed between the polarizing layer and the sensing conductive layer. The polarizing adhesive layer is in contact with the sensing conductive layer.

In an exemplary embodiment, the substrate includes a main region, a subsidiary region, and a bending region located between the main region and the subsidiary region. The sensing member overlaps the main region, the subsidiary region and the bending region, and the polarizing member overlaps the main region.

In an exemplary embodiment, the sensing insulating layer includes a first sensing insulating layer and a second sensing insulating layer. The sensing conductive layer includes a first sensing conductive layer disposed between the first sensing insulating layer and the second sensing insulating layer, and a second sensing conductive layer disposed between the second sensing insulating layer and the polarizing adhesive layer. The second sensing conductive layer is in direct contact with the polarizing adhesive layer.

In an exemplary embodiment, the second sensing conductive layer is disposed in the main region and the subsidiary region, and is not disposed in the bending region.

In an exemplary embodiment, the display device further includes a bending protective layer overlapping the bending region. The bending protective layer is in direct contact with an exposed side surface of the second sensing conductive layer.

In an exemplary embodiment, a side surface of the bending protective layer is in contact with a side surface of the polarizing member with no spacing therebetween.

In an exemplary embodiment, the sensing member includes a sensing region and a non-sensing region disposed around the sensing region. The sensing conductive layer includes a sensing electrode disposed in the sensing region and a first sensing connection line connected to the sensing electrode and disposed in the non-sensing region. The first sensing connection line is disposed in the main region and an exposed side surface of the first sensing connection line is in contact with the bending protective layer.

In an exemplary embodiment, the display member includes a display connection line disposed on the substrate in an entirety of the bending region, in a part of the main region and in a part of the subsidiary region. The display connection line is electrically connected to the first sensing connection line.

In an exemplary embodiment, the display connection line is electrically connected to the first sensing connection line through a first contact hole in the main region, and overlaps the bending protective layer in a thickness direction in the bending region.

In an exemplary embodiment, the second sensing conductive layer further includes a second sensing connection line disposed in the non-sensing region and in the subsidiary region. The second sensing connection line is electrically connected to the display connection line. An exposed side surface of the second sensing connection line is in direct contact with the bending protective layer.

In an exemplary embodiment, the second sensing connection line is in electrical contact with the display connection line through a contact hole in the subsidiary region.

In an exemplary embodiment, the bending protective layer is extended to a part of the main region and a part of the subsidiary region, and is in contact with an upper surface of the first sensing connection line and the second sensing connection line.

In an exemplary embodiment, the display device further includes a driving integrated circuit disposed in the subsidiary region. The second sensing connection line forms a sensing pad, and the sensing pad is coupled to the driving integrated circuit.

In an exemplary embodiment, the display device further includes a cover substrate disposed in the subsidiary region. The cover substrate is in direct contact with the bending protective layer.

According to an exemplary embodiment of the present disclosure, a display device includes a display member including a substrate having a main region, a subsidiary region and a bending region located between the main region and the subsidiary region. The display device further includes a plurality of light-emitting elements disposed on the substrate, a sensing member disposed on the display member and overlapping the main region, the subsidiary region and the bending region, and a polarizing member disposed on the sensing member and overlapping the main region. The sensing member includes a first sensing insulating layer and a first sensing conductive layer disposed on the first sensing insulating layer. The polarizing member includes a polarizing adhesive layer and a polarizing layer disposed on the polarizing adhesive layer. The polarizing adhesive layer is in contact with the first sensing conductive layer.

In an exemplary embodiment, the first sensing conductive layer is disposed in the main region and the subsidiary region, and is not disposed in the bending region.

In an exemplary embodiment, the display device further includes a bending protective layer overlapping the bending region. The bending protective layer is in direct contact with an exposed side surface of the first sensing conductive layer.

In an exemplary embodiment, a side surface of the bending protective layer is in contact with a side surface of the polarizing member with no spacing therebetween.

In an exemplary embodiment, the first sensing conductive layer includes a plurality of sensing electrodes spaced apart from one another and a plurality of first sensing connection lines connected to the sensing electrodes. A first one of the first sensing connection lines is disposed in the main region, and an exposed side surface of the first one of the first sensing connection lines is in contact with the bending protective layer.

In an exemplary embodiment, the display member includes a display connection line disposed on the substrate in an entirety of the bending region, in a part of the main region and in a part of the subsidiary region. The display connection line is electrically connected to the first one of the first sensing connection lines.

In an exemplary embodiment, the display connection line is electrically connected to the one of the first sensing connection lines through a first contact hole in the main region, and overlaps the bending protective layer in a thickness direction in the bending region.

In an exemplary embodiment, the first sensing conductive layer further includes a second sensing connection line disposed in the subsidiary region. The second sensing line is electrically connected to the display connection line. An exposed side surface of the second sensing connection line is in direct contact with the bending protective layer.

According to an exemplary embodiment of the present disclosure, a display device includes a display member including a substrate having a main region, a subsidiary region and a bending region located between the main region and the subsidiary region, and a plurality of light-emitting elements disposed on the substrate. The display device further includes a sensing member disposed on the display member and overlapping the main region, the subsidiary region and the bending region, and a light-blocking pattern and a color filter layer disposed on the sensing member and overlapping the main region. The sensing member includes a first sensing insulating layer, a first sensing conductive layer disposed on the first sensing insulating layer, a second sensing insulating layer disposed on the first sensing conductive layer, and a second sensing conductive layer disposed on the second sensing insulating layer. The light-blocking pattern is in direct contact with the second sensing conductive layer.

In an exemplary embodiment, the light-blocking pattern partially exposes an upper surface of the second sensing insulating layer, and the color filter layer is in direct contact with the exposed upper surface of the second sensing insulating layer.

According to an exemplary embodiment of the present disclosure, a method for fabricating a display device includes covering a surface of a sensing member disposed on a display member with a protective film, in which the protective film includes a film layer and an adhesive layer disposed on the film layer, peeling off the protective film from the surface of the sensing member, and attaching a polarizing member on the surface of the sensing member after the protective film is peeled off. The sensing member includes a first sensing insulating layer, a first sensing conductive layer disposed on the first sensing insulating layer, a second sensing insulating layer disposed on the first sensing conductive layer, and a second sensing conductive layer disposed on the second sensing insulating layer. After covering the surface of the sensing member with the protective film, the adhesive layer is in direct contact with the second sensing conductive layer.

In an exemplary embodiment, the adhesive layer of the protective film includes an inorganic adhesive material.

According to an exemplary embodiment of the present disclosure, no organic layer is deposited on a sensing member in a display device. Thus, the thickness of the display device can be reduced.

According to an exemplary embodiment of the present disclosure, the number of masks used for a process of depositing an organic layer on the sensing member as described above can be reduced.

BRIEF DESCRIPTION OF THE DRAWINGS

The above and other aspects and features of the present disclosure will become more apparent by describing in detail exemplary embodiments thereof with reference to the accompanying drawings, in which.

DETAILED DESCRIPTION OF THE EXEMPLARY EMBODIMENTS

Figure 1:
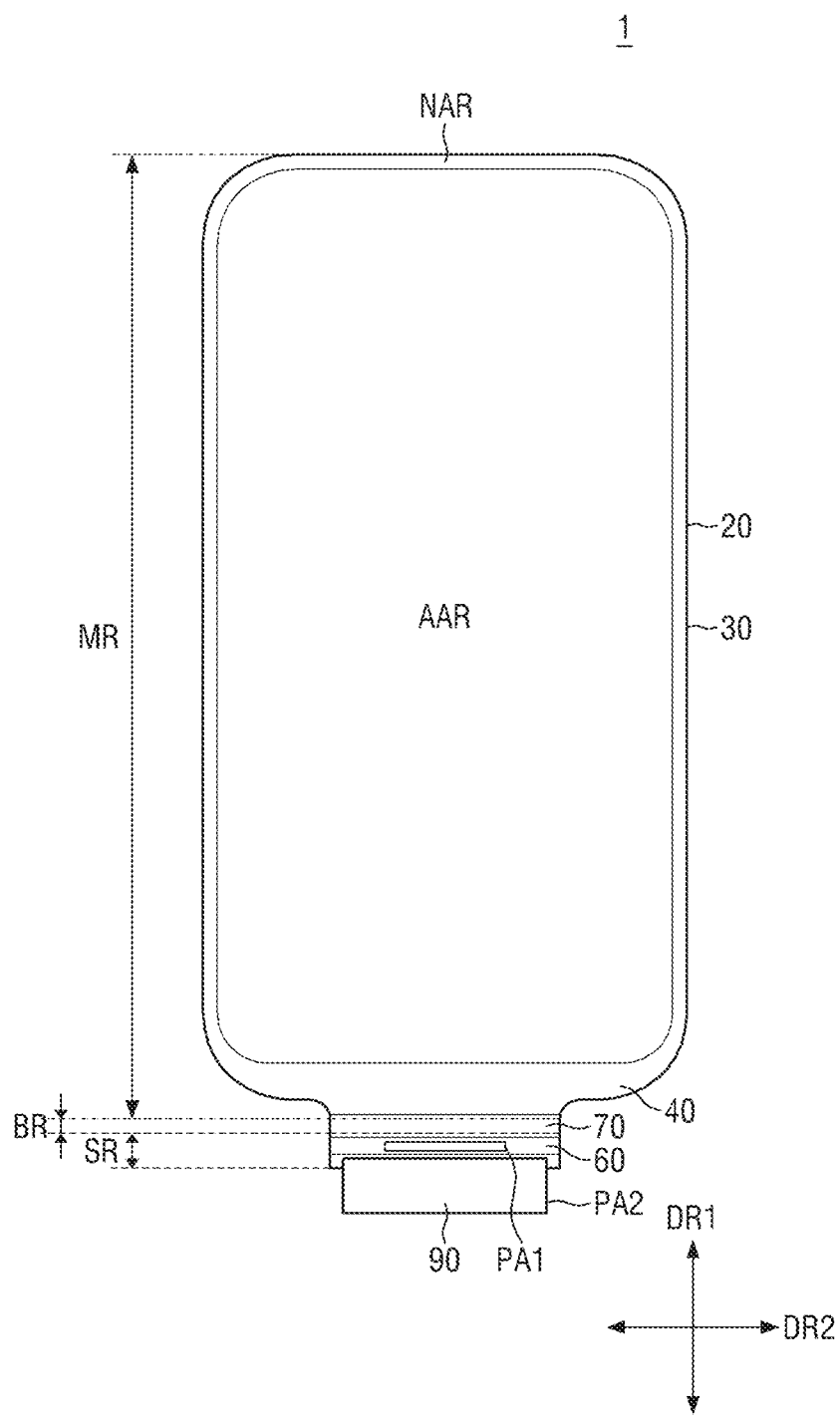
FIG. 1 is a plan view of a display device according to an exemplary embodiment of the present disclosure.

Exemplary embodiments of the present disclosure will be described more fully hereinafter with reference to the accompanying drawings. Like reference numerals may refer to like elements throughout the accompanying drawings.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words use to describe the relationship between elements should be interpreted in a like fashion.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

It should be understood that descriptions of features or aspects within each exemplary embodiment should typically be considered as available for other similar features or aspects in other exemplary embodiments, unless the context clearly indicates otherwise.

As used herein, the singular forms "a", "an" and "the" are intended to include the plural forms as well, unless the context clearly indicates otherwise.

Figure 2:
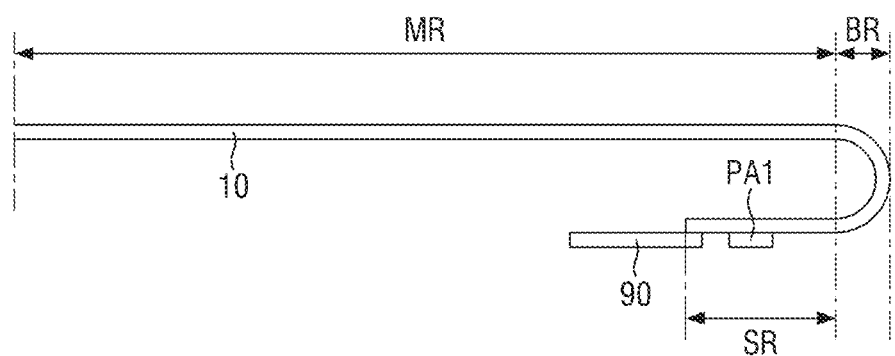
FIG. 2 is a cross-sectional view of a display device according to an exemplary embodiment of the present disclosure when the display device is bent.
Figure 3:
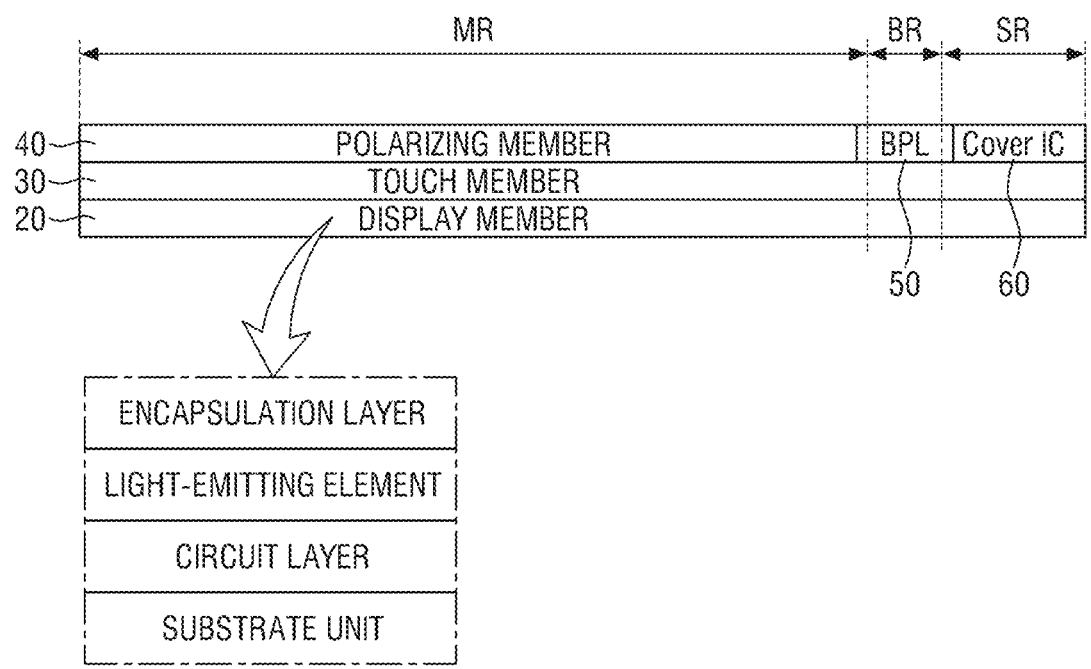
FIG. 3 is a cross-sectional view of a display device according to an exemplary embodiment of the present disclosure.

FIG. 1 is a plan view of a display device according to an exemplary embodiment of the present disclosure. FIG. 2 is a cross-sectional view of a display device according to an exemplary embodiment of the present disclosure when the display device is bent. FIG. 3 is a cross-sectional view of a display device according to an exemplary embodiment of the present disclosure.

In exemplary embodiments, a first direction D1 may intersect a second direction D2. In the plan view of FIG. 1, the first direction DR1 is defined as the vertical direction and the second direction DR2 is defined as the horizontal direction. In the following description, the upper arrow in the first direction DR1 indicates the upper side, the lower arrow in the first direction DR1 indicates the lower side, the right arrow in the second direction DR2 indicates the right side, and the left arrow in the second direction DR2 indicates the left side when viewed from the top. It should be understood that the directions referred with respect to the exemplary embodiments are relative directions, and the exemplary embodiments are not limited to the directions mentioned.

Referring to FIGS. 1 to 3, a display device 1 may refer to any electronic device providing a display screen. The display device 1 may include portable electronic devices such as, for example, a mobile phone, a smartphone, a tablet personal computer (PC), an electronic watch, a smartwatch, a mobile communications terminal, an electronic notebook, an electronic book, a portable multimedia player (PMP), a navigation device, a game console, a digital camera, a television set, a laptop computer, a monitor, an electronic billboard, Internet of Things devices, etc.

The display device 1 includes an active area AAR and a non-active area NAR. In the display device 1, a display area may be defined as an area in which images are displayed while a non-display area may be defined as an area in which images are not displayed. In addition, a sensing area may be defined as an area in which a sensing input is sensed. The display area and the sensing area may be included in the active area AAR. The display area and the sensing area may overlap with each other. For example, images may be displayed and a sensing input may be sensed in the active area AAR. The shape of the active area AAR may be, for example, a rectangle or a rectangle with rounded corners. In the example shown, the shape of the active area AAR is a rectangle having rounded corners and having its sides extending in the first direction DR1 longer than its sides extending in the second direction DR2. It is, however, to be understood that the present disclosure is not limited thereto. For example, the active area AAR may have various shapes such as a rectangular shape with its sides in the second direction DR2 longer than its sides in the first direction DR1, a square shape, other polygonal shapes, a circular shape, an elliptical shape, etc.

The non-active area NAR is disposed around the active area AAR. The non-active area NAR may be, for example, a bezel area (e.g., an area in which a bezel is disposed). The non-active area NAR may surround all sides (four sides in the drawings) of the active area AAR. It is, however, to be understood that the present disclosure is not limited thereto. For example, in exemplary embodiments, the non-active area NAR may not be disposed near the upper side of the active region AAR or near the left or right side thereof.

In the non-active area NAR, signal lines for applying signals to the active area AAR (display area or sensing area) or driving circuits may be disposed. In an exemplary embodiment, the non-active area NAR does not include a display area and does not include a sensing area. Thus, in an exemplary embodiment, images are not displayed and sensing input is not sensed in the non-active area NAR. In an exemplary embodiment, the non-active area NAR may include a part of the sensing area, and a sensor member such as, for example, a pressure sensor may be disposed in that part. In exemplary embodiments, the active area AAR may be completely identical to the display area in which images are displayed, and the non-active area NAR may be completely identical to the non-display area in which no image is displayed.

In an exemplary embodiment, a sensing region in which touch inputs are sensed may correspond to the active area AAR, and a non-sensing region in which touch inputs are not sensed may correspond to the non-active area NAR. Accordingly, a sensing conducive layer(s) including a sensing electrode(s) may be disposed in the sensing region, and a connection line(s) connected to the sensing electrode(s) may be disposed in the non-sensing region.

The display device 1 includes a display panel 10 for providing a display screen. Examples of the display panel 10 may include an organic light-emitting display panel, a micro LED display panel, a nano LED display panel, a quantum-dot display panel, a liquid-crystal display panel, a plasma display panel, a field emission display panel, an electrophoretic display panel, an electrowetting display panel, etc. In the following description, for convenience of explanation, an organic light-emitting display panel is employed as an example of the display panel 10. However, the present disclosure is not limited thereto.

The display device 1 may further include a sensing member for sensing a sensing input. The sensing member may be provided as a panel or film separated from the display panel 10 to be attached on the display panel 10, or may be provided in the form of a sensing layer inside the display panel 10. Although the sensing member is provided inside the display panel to be included in the display panel 10 in the following description, it is to be understood that the present disclosure is not limited thereto. The sensing member may also be referred to herein as a touchscreen member.

The display panel 10 may include a flexible substrate including a flexible polymer material such as, for example, polyimide. Accordingly, the display panel 10 may be curved, bent, folded, or rolled.

The display panel 10 may include a bending region BR. The display panel 10 may be divided into a main region MR located on one side of the bending region BR and a subsidiary region SR located on the other side of the bending region BR.

The display area of the display panel 10 is located in the main region MR. The display area includes a plurality of pixels. In an exemplary embodiment, the edge portion of the display area in the main region MR, the entire bending region BR and the entire subsidiary region SR may be the non-display area. It is, however, to be understood that the present disclosure is not limited thereto. The bending region BR and/or the subsidiary region SR may also include the display area.

The main region MR may have a shape generally similar to that of the display device 1 when viewed from the top. The main region MR may be a flat area located in one plane. It is, however, to be understood that the present disclosure is not limited thereto. At least one of the edges of the main region MR except for the edge (side) connected to the bending region BR may be bent to form a curved surface, or may be bent at a right angle.

When at least one of the edges of the main region MR except for the edge (side) connected to the bending region BR is curved or bent, the display area may also be disposed at the edge. It is, however, to be understood that the present disclosure is not limited thereto. The curved or bent edge may be the non-display area that does not display an image, or the display area and the non-display area may be disposed together.

The bending region BR is connected to one side of the main region MR in the first direction DR1. For example, the bending region BR may be connected to the lower shorter side of the main region MR. The width of the bending region BR may be less than the width (width of the shorter side) of the main region MR. The portions where the main region MR meets the bending region BR may be cut in an L-shape.

In the bending region BR, the display panel 10 may be bent downward in the thickness direction, i.e., in the direction away from the display surface with a curvature. Although the bending region BR may have a constant radius of curvature, the present disclosure is not limited thereto. For example, the bending region BR may have different radii of curvature for difference sections. As the display panel 10 is bent at the bending region BR, the surface of the display panel 10 may be reversed. For example, the surface of the display panel 10 facing upward may be bent such that it faces outward at the bending region BR and then faces downward.

The subsidiary region SR is extended from the bending region BR. The subsidiary region SR may also be referred to herein as a sub-region SR. The sub-region SR may be extended in a direction parallel to the main region MR after the display device has been bent. The sub region SR may overlap with the main region MR in the thickness direction of the display panel 10. The width of the subsidiary region SR (the width in the second direction DR2) may be, but is not limited to being, about equal to the width of the bending region BR.

The sub region SR may include a first pad area PA1 and a second pad area PA2. The second pad PS2 is located farther from the bending region BR than the first pad area PA1, as shown in the plan view of FIG. 1. A driving chip 70 may be disposed in the first pad area PA1 of the sub region SR. The driving chip 70 may include, for example, an integrated circuit for driving the display panel 10, and thus, may be referred to as a driving integrated circuit. The integrated circuit may include an integrated circuit for display and/or an integrated circuit for a sensing unit. The integrated circuit for a display and the integrated circuit for a sensing unit may be provided as separate chips or may be integrated into a single chip.

A plurality of display signal line pads and a plurality of sensing signal line pads may be disposed in the second pad area PA2 of the sub region SR of the display panel 10. A driving board 90 may be connected to the second pad area PA2 of the subsidiary region SR of the display panel 10. The driving board 90 may be, for example, a flexible printed circuit board or a film.

Referring to FIG. 3, the display panel 10 may include a display member 20, a sensing member 30 (also referred to as a touch member), a polarizing member 40, a bending protective layer (BPL) 50, and a cover film (Cover IC) 60. The display member 20 may be disposed across the main area MR, the bending region BR and the subsidiary region SR. As shown in the enlarged view of FIG. 3, the display member 20 includes a substrate 101, a circuit layer (e.g., a layer including a plurality of thin-film transistors TR) disposed on the substrate 101, a light-emitting element layer (e.g., an emission layer 122) disposed on the circuit layer, and an encapsulation layer 116 disposed on the light-emitting layer (see FIG. 4). The light-emitting element layer may include a plurality of light-emitting elements for displaying an image. The display panel 10 may further include a first electrode 121 disposed under the emission layer, and a second electrode 123 disposed on the emission layer (see FIG. 4). The first electrode, the emission layer and the second electrode may form a light-emitting element. The light-emitting element may be disposed in each of the pixels.

The shape of the display member 20 may be substantially identical to the shape of the display panel 10 described above when viewed from a plan view. For example, the display member 20 may have a shape substantially identical to the shape of the main region MR, the bending region BR and the subsidiary region SR when viewed from a plan view.

The sensing member 30 may be disposed on the display member 20. The sensing member 30 may detect a touch input. The sensing member 30 may be disposed across the main area MR, the bending region BR and the subsidiary region SR. That is, the sensing member 30 may overlap the main region MR, the subsidiary region SR and the bending region BR. The sensing member 30 may be formed directly on the display member 20. As will be described later, the sensing member 30 may include, for example, a first sensing insulating layer, a first sensing conductive layer disposed on the first sensing insulating layer, a second sensing insulating layer disposed on the first sensing conductive layer, and a second sensing conductive layer disposed on the second sensing insulating layer.

The second sensing conductive layer may be the top layer of the sensing member 30. The second sensing conductive layer and the second sensing insulating layer of the sensing member 30 may be exposed to the outside. According to an exemplary embodiment, the thickness of the display device 1 can be reduced by disposing the second sensing conductive layer at the top of the sensing member 30, and eliminating a protective layer covering the second sensing conductive layer such as, for example, an organic layer.

Since the second sensing conductive layer is exposed, however, external air or moisture may permeate into the second sensing conductive layer, which may result in corrosion of the second sensing conductive layer. To prevent this, in the display panel 10 according to an exemplary embodiment, the polarizing member 40 is disposed in the main region MR, the bending protective layer 50 is disposed in the bending region BR, and the cover film 60 is disposed in the subsidiary region SR, thus covering and protecting the exposed second sensing conductive layer. The polarizing member 40, the bending protective layer 50 and the cover film 60 may be disposed on the sensing member 30.

The shape of the sensing member 30 may be substantially identical to the shape of the display member 20 when viewed from a plan view. For example, the sensing member 30 may have a shape substantially identical to the shape of the main region MR, the bending region BR and the subsidiary region SR when viewed from a plan view.

As shown in FIG. 3, in an exemplary embodiment, the polarizing member 40 overlaps with the main region MR generally in the thickness direction and is not disposed in the bending region BR. The bending protective layer 50 may overlap with the bending region BR completely and may be expanded to a part of the main region MR and the subsidiary region SR adjacent to the bending region BR. The side surface of the polarizing member 40 may be in contact (e.g., direct contact) with the side surface of the bending protective layer 50. For example, in an exemplary embodiment, no spacing is formed between the side surface of the polarizing member 40 and the side surface of the bending protective layer 50. The boundary between the side surface of the bending protective layer 50 and the side surface of the polarizing member 40 may be located in the main region MR.

In an exemplary embodiment, the cover film 60 overlaps with the subsidiary region SR generally in the thickness direction and is not disposed in the bending region BR. The side surface of the bending protective layer 50 may be in contact (e.g., direct contact) with the side surface of the cover film 60. For example, in an exemplary embodiment, there is no spacing between the side surface of the bending protective layer 50 and the side surface of the cover film 60. The boundary between the other side surface of the bending protective layer 50 and the side surface of the cover film 60 may be located in the subsidiary region SR.

Referring back to FIG. 1, the shape of the polarizing member 40 may be substantially identical to the shape of the portion of the sensing member 30 disposed within the main region MR described above when viewed from a plan view. In exemplary embodiments, the polarizing member 40 may be smaller than the sensing member 30 when viewed from a plan view, so that a part of the edge of the portion of the sensing member 30 falling within the main region MR may be exposed.

The shape of the bending protective layer 50 may be substantially identical to the shape of the portion of the sensing member 30 falling within the bending region BR described above when viewed from a plan view. The shape of the bending protective layer 50 when viewed from a plan view may be substantially a rectangle. In exemplary embodiments, the bending protective layer 50 may be smaller than the sensing member 30 when viewed from a plan view. For example, the width of the bending protective layer 50 in the second direction DR2 may be smaller than the width of the sensing member 30 in the second direction DR2.

The shape of the cover film 60 may be substantially identical to the shape of the portion of the sensing member 30 disposed within the subsidiary region BR described above when viewed from a plan view. The shape of the cover film 60 when viewed from a plan view may be substantially a rectangle. In exemplary embodiments, the cover film 60 may be smaller than the sensing member 30 when viewed from a plan view. For example, the width of the cover film 60 in the second direction DR2 may be smaller than the width of the sensing member 30 in the second direction DR2.

Figure 4:
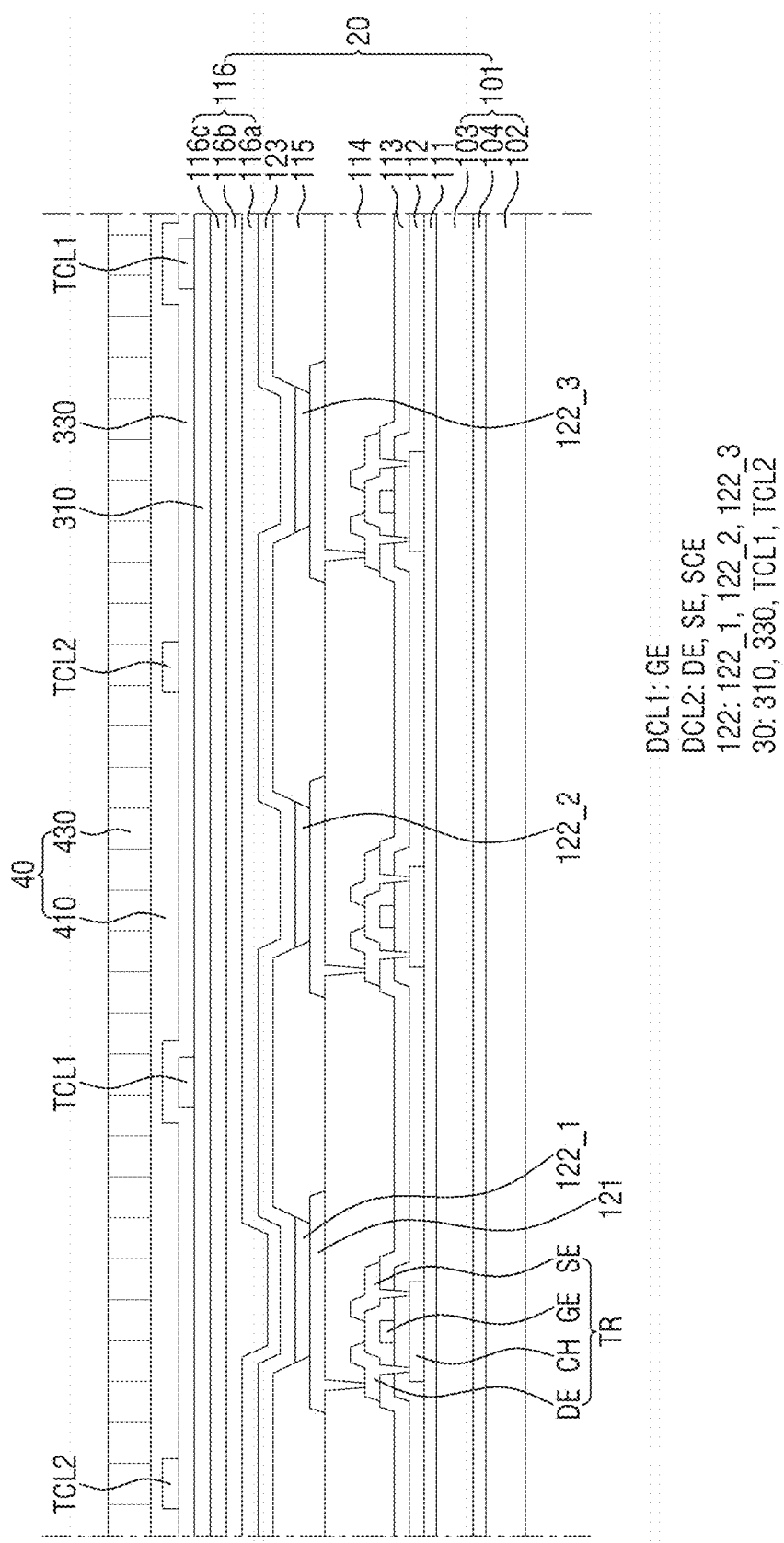
FIG. 4 is a cross-sectional view of a main region of a display device according to an exemplary embodiment of the present disclosure.
Figure 5:
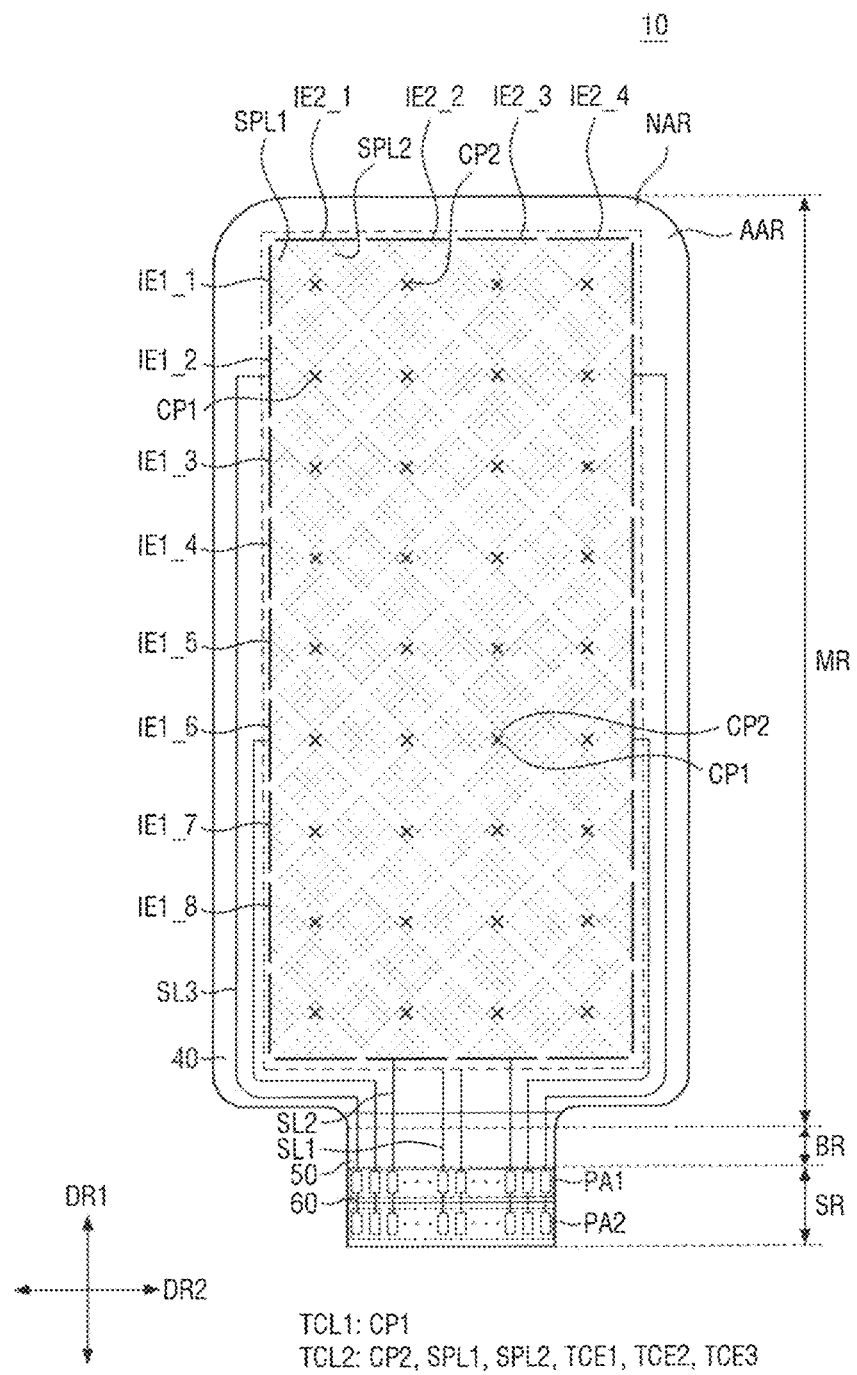
FIG. 5 is a plan view showing a layout of a display member and a sensing member of a display device according to an exemplary embodiment of the present disclosure.
Figure 6:
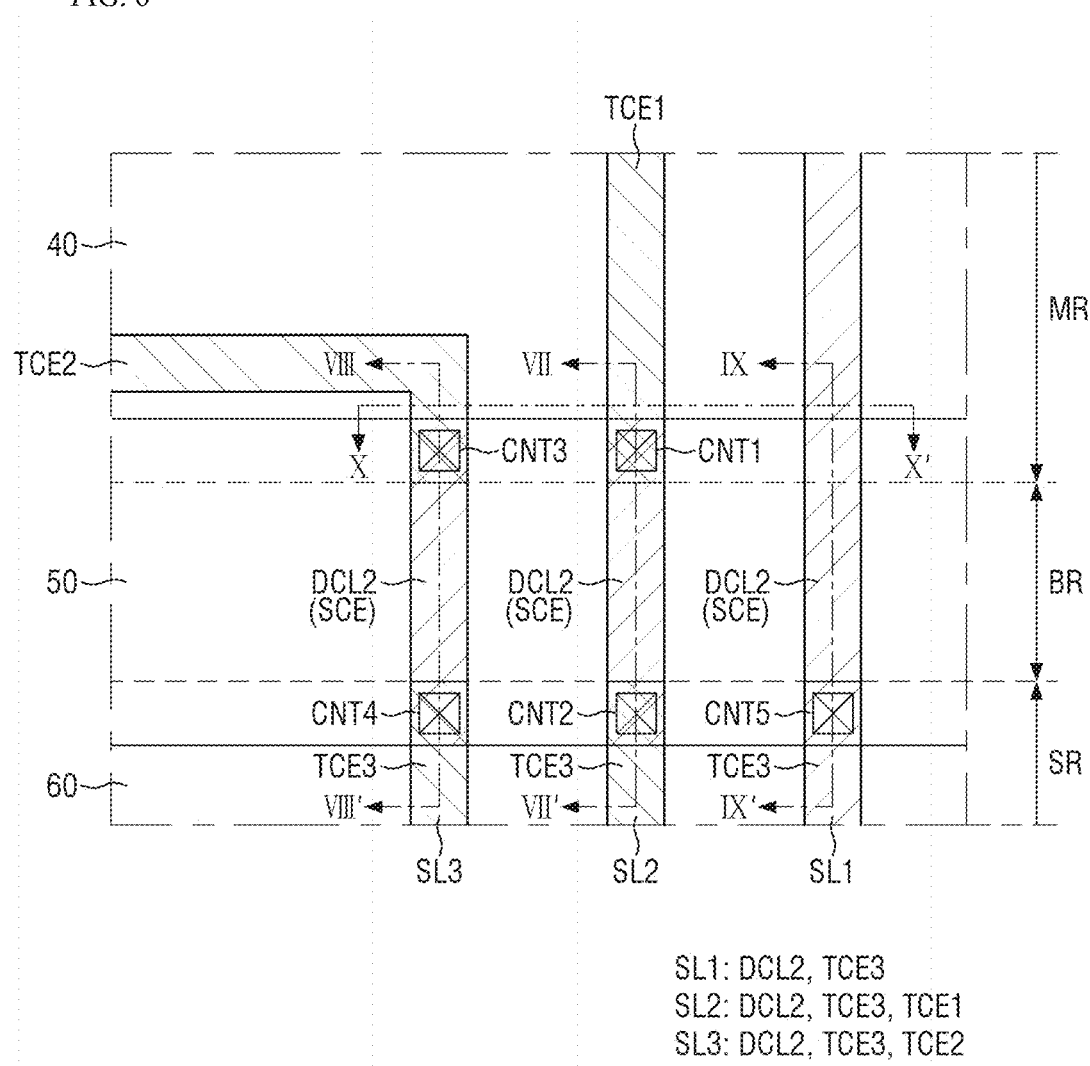
FIG. 6 is a view showing a layout of signal lines arranged in a main region, a bending region and a subsidiary region according to an exemplary embodiment of the present disclosure.
Figure 7:
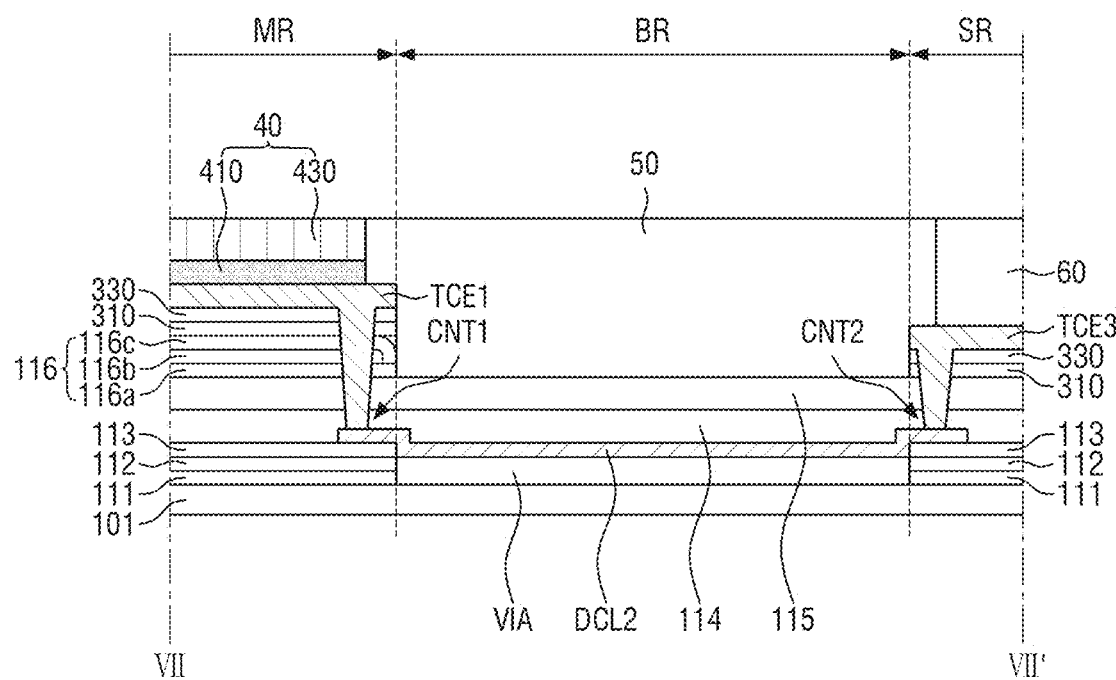
FIG. 7 is a cross-sectional view taken along line VII-VII' of FIG. 6.
Figure 8:
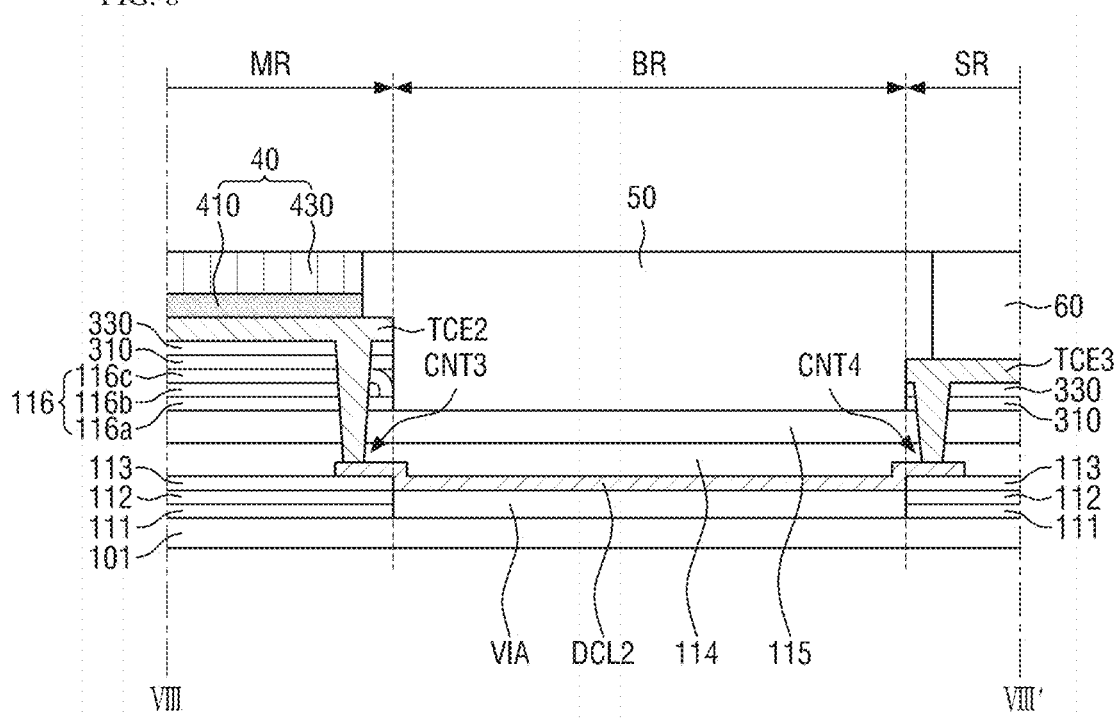
FIG. 8 is a cross-sectional view taken along line VIII-VIII' of FIG. 6.
Figure 9:
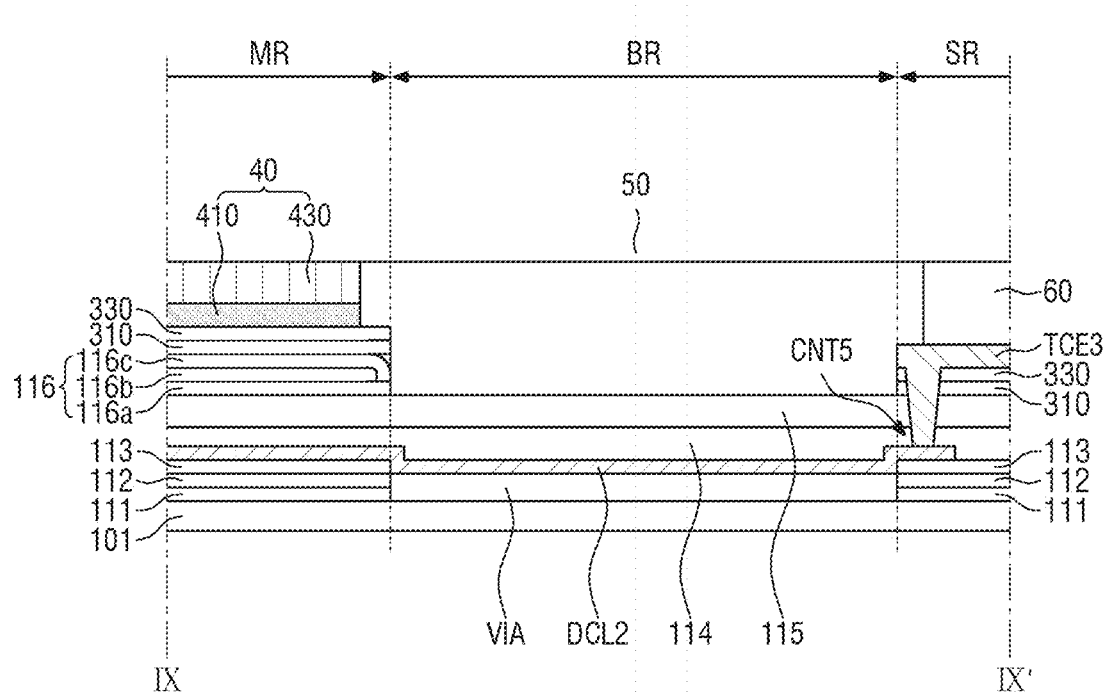
FIG. 9 is a cross-sectional view taken along line IX-IX' of FIG. 6.
Figure 10:
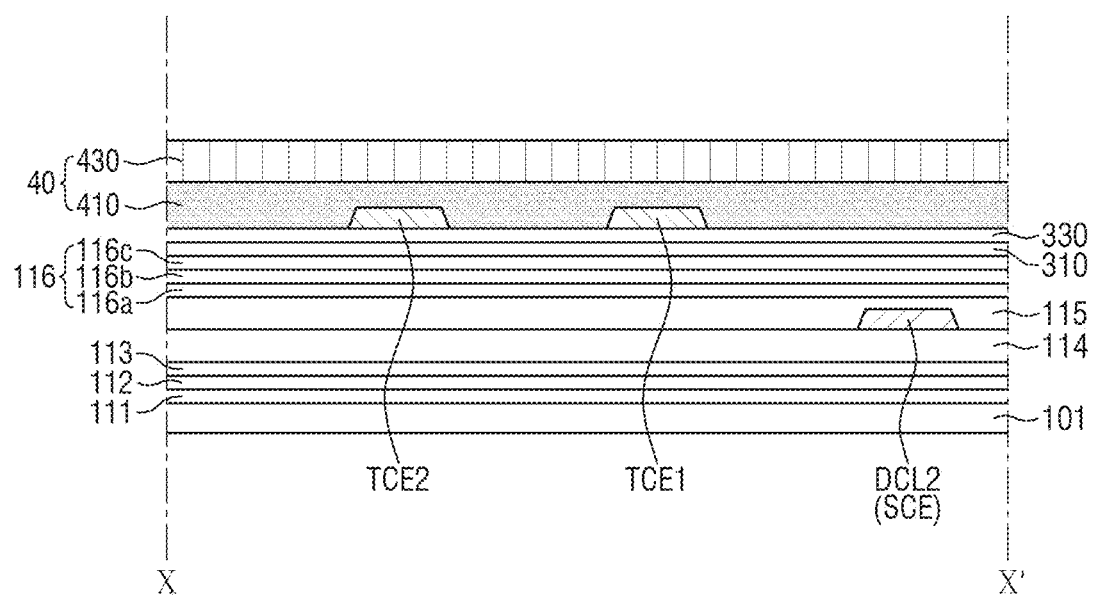
FIG. 10 is a cross-sectional view taken along line X-X' of FIG. 6.

FIG. 4 is a cross-sectional view of a main region of a display device according to an exemplary embodiment of the present disclosure. FIG. 5 is a plan view showing a layout of a display member and a sensing member of a display device according to an exemplary embodiment of the present disclosure. FIG. 6 is a view showing a layout of signal lines arranged in a main region, a bending region and a subsidiary region according to an exemplary embodiment of the present disclosure. FIG. 7 is a cross-sectional view taken along line VII-VII' of FIG. 6. FIG. 8 is a cross-sectional view taken along line VIII-VIII' of FIG. 6. FIG. 9 is a cross-sectional view taken along line IX-IX' of FIG. 6. FIG. 10 is a cross-sectional view taken along line X-X' of FIG. 6.

Referring to FIGS. 4 to 10, the substrate 101 may include a first support substrate 102, a second support substrate 103 disposed on the first support substrate 102, and a barrier layer 104 disposed between the first support substrate 102 and the second support substrate 103. The first support substrate 102 and the second support substrate 103 may be a flexible substrate as described above. For example, each of the first support substrate 102 and the second support substrate 103 may be a film substrate or a plastic substrate containing a polymer organic material. For example, the first support substrate 102 and the second support substrate 103 may be formed of at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. In addition, the substrate 101 may include fiberglass reinforced plastic (FRP).

The barrier layer 104 may be disposed between the first support substrate 102 and the second support substrate 103. The barrier layer 104 may couple the first and second support substrates 102 and 103 together, and may make the first and second support substrates 102 and 103 flat. The barrier layer 104 may be made of an inorganic material.

A buffer layer 111 is disposed on the substrate 101. The buffer layer 111 may be disposed on the second support substrate 103. The buffer layer 111 may smoothen the surface of the substrate 101 and prevent the permeation of moisture or external air. The buffer layer 111 may be an inorganic layer. The buffer layer 111 may be made up of a single layer or multiple layers.

A plurality of thin-film transistors TR may be disposed on the buffer layer 111. The plurality of thin-film transistors TR may be, for example, driving thin-film transistors. At least one thin-film transistor TR may be disposed in each of the pixels. Each of the thin-film transistors TR may include, for example, a semiconductor layer CH, a gate electrode GE, a source electrode SE, and a drain electrode DE.

The semiconductor layer CH is disposed on the buffer layer 111. In an exemplary embodiment, the semiconductor layer CH may include, for example, amorphous silicon, poly silicon, and an organic semiconductor. In an exemplary embodiment, the semiconductor layer CH may be an oxide semiconductor. The semiconductor layer CH may include a channel region, and a source region and a drain region, which are disposed on the sides of the channel region, respectively, may be doped with impurities.

A gate insulating layer 112 is disposed on the semiconductor layer CH. The gate insulating layer 112 may be, for example, an inorganic layer. The gate insulating layer 112 may be made up of a single layer or multiple layers.

A first conductive layer DCL1 may be disposed on the gate insulating layer 112. The first conductive layer DCL1 may include the gate electrode GE. The first conductive layer DCL1 may further include a plurality of scan lines. The gate electrode GE may be connected to one of the plurality of scan lines.

The first conductive layer DCL1 may be made of a conductive metal material. For example, the first conductive layer DCL1 may include molybdenum (Mo), aluminum (Al), copper (Cu), and titanium (Ti). The first conductive layer DCL1 may be made up of a single layer or multiple layers.

An interlayer dielectric layer 113 is disposed on the first conductive layer DCL1. The interlayer dielectric layer 113 may be, for example, an inorganic layer. The interlayer dielectric layer 113 may be made up of a single layer or multiple layers.

A second conductive layer DCL2 may be disposed on the interlayer dielectric layer 113. The second conductive layer DCL2 may include the source electrode SE, the drain electrode DE, and a source connection electrode SCE. The second conductive layer DCL2 may include, but is not limited to, a high-level voltage wiring, a low-level voltage wiring, and a plurality of data lines, display connection lines, etc. Herein, the term "display connection line" may refer to a conductive line or electrode used to display an image, and the term "sensing connection line" may refer to a conductive line or electrode used to sense an input (e.g., to detect a touch input). For example, a display connection line may refer to a line or electrode that transmits data to a pixel for displaying an image, and a sensing connection line may refer to a line or electrode that connects to a sensing electrode for sensing an input (e.g., for detecting a touch input). In an exemplary embodiment, the second conductive layer DCL2 may be disposed in an entirety of the bending region BR, in a part of the main region MR, and in a part of the subsidiary region SR.

The source electrode SE and the drain electrode DE may be electrically connected to the source region and the drain region of the semiconductor layer CH, respectively, through a contact hole formed through the interlayer dielectric layer 113 and the gate insulating layer 112.

The source connection electrode SCE may be electrically connected to the thin-film transistor of each pixel, and may also be referred to herein as a connection line. The source connection electrode SCE may be electrically connected to the sensing member 30 through a contact hole. The second conductive layer DCL2 is made of a conductive metal material. For example, the second conductive layer DCL2 may include aluminum (Al), copper (Cu), titanium (Ti), and molybdenum (Mo).

The display device 1 may further include a storage capacitor and a switching thin-film transistor disposed on the substrate 101.

A protective layer 114 is disposed on the second conductive layer DCL2 and the interlayer dielectric layer 113. The protective layer 114 covers a pixel circuitry including the thin-film transistor TR. The protective layer 114 may be a planarization layer. The planarization layer may include a material such as, for example, acrylic and polyimide.

A plurality of first electrodes 121 may be disposed on the protective layer 114. The first electrodes 121 may be pixel electrodes each disposed in respective pixels. Each of the first electrodes 121 may be an anode electrode of an organic light-emitting diode.

The first electrode 121 may be electrically connected to the drain electrode DE or the source electrode SE disposed on the substrate 101 through a via hole passing through the protective layer 114.

The first electrode 121 may include a material having a high work function. The first electrode 121 may include, for example, indium-tin-oxide (ITO), indium-zinc-oxide (IZO), zinc oxide (ZnO), indium oxide ($In_2O_3$), etc. The above-listed conductive materials have a relatively high work function and are transparent. When the organic light-emitting display device is a top-emission organic light-emitting display device, the first electrode 121 may further include a reflective material such as, for example, silver (Ag), magnesium (Mg), aluminum (Al), platinum (Pt), lead (Pb), gold (Au), nickel (Ni), neodymium (Nd), iridium (Ir), chrome (Cr), lithium (Li), calcium (Ca) or a combination thereof, in addition to the above-listed conductive materials. Accordingly, the first electrodes 121 may have a single-layer structure including the above-listed conductive material and the reflective material, or may have a multi-layer structure in which the single layers are stacked on one another.

A bank 115 is disposed on the first electrode 121. The bank 115 includes openings each exposing at least a part of the respective first electrodes 121. The bank 115 may include an organic material or an inorganic material. In an exemplary embodiment, the bank 115 may include a material such as, for example, a photoresist, a polyimide resin, an acrylic resin, a silicon compound and a polyacrylic resin.

The organic emission layer 122 is disposed on the portion of the first electrode 121 that is not covered by the bank 115. The organic emission layer 122 may be a color emission layer emitting a particular color. For example, the organic emission layer 122 may include a red emission layer 122_1 for emitting red light, a green emission layer 122_2 for emitting green light, and a blue emission layer 122_3 for emitting blue light. The color emission layers may be disposed in the pixels, respectively.

In exemplary embodiments, the organic emission layer 122 may be formed as a single piece, unlike as shown in FIG. 4. For example, in an exemplary embodiment, a single organic emission layer 122 may be shared by the pixels. The organic emission layer 122 may be made up of a color emission layer emitting light of a specific color. For example, the organic emission layer 122 may be a blue emission layer emitting blue light. In this instance, wavelength conversion patterns may be further disposed above the organic emission layer 122 for converting the color of the light emitted from the organic emission layer 122.

A second electrode 123 is disposed on the organic emission layer 122. The second electrode 123 may be a common electrode that extends across all of the pixels. The second electrode 123 may be a cathode electrode of an organic light-emitting diode.

The second electrode 123 may be made of a material having a low work function. The second electrode 123 may include, for example, Li, Ca, LiF/Ca, LiF/Al, Al, Mg, Ag, Pt, Pd, Ni, Au, Nd, Ir, Cr, BaF, Ba, or a compound or mixture thereof (e.g., a mixture of Ag and Mg). The second electrode 123 may further include an auxiliary electrode. The auxiliary electrode may include a layer formed by depositing the material, and a transparent metal oxide such as, for example, indium-tin-oxide (ITO), indium-zinc-oxide (IZO), zinc oxide (ZnO) and indium-tin-zinc-oxide (ITZO), on the layer.

When the display device 1 is a top-emission organic light-emitting diode display device, a thin conductive layer having a small work function may be formed as the second electrode 123, and a transparent conductive layer such as, for example, an indium-tin-oxide (ITO) layer, an indium-zinc-oxide (IZO) layer, a zinc oxide (ZnO) layer and an indium oxide ($In_2O_3$) layer, may be formed thereon.

As described above, the first electrode 121, the organic emission layer 122 and the second electrode 123 may form a light-emitting element.

A hole injection layer and/or a hole transport layer may be disposed between the first electrode 121 and the organic emission layer 122, and an electron transport layer and/or an electron injection layer may be disposed between the organic emission layer and the second electrode 123.

An encapsulation layer 116 is disposed on the second electrode 123. The encapsulation layer 116 includes at least one inorganic layer and at least one organic layer. The at least one inorganic layer and the at least one organic layer may be stacked on one another. For example, the encapsulation layer 116 may be made up of multiple layers including a first inorganic encapsulation layer 116a, an organic encapsulation layer 116b and a second inorganic encapsulation layer 116c, which are sequentially stacked on one another in this order, as shown in FIG. 4. The first inorganic encapsulation layer 116a and the second inorganic encapsulation layer 116c may include one or more of, for example, silicon oxide (SiOx), silicon nitride (SiNx) and silicon oxynitride (SiONx). The organic encapsulation layer 116b may include one of, for example, epoxy, acrylate and urethane acrylate.

The sensing member 30 is disposed on the encapsulation layer 116. The sensing member 30 may be in direct contact with the upper surface of the second inorganic encapsulation layer 116c of the encapsulation layer 116.

The sensing member 30 may include a first sensing insulating layer 310, a first sensing conductive layer TCL1 disposed on the first sensing insulating layer 310, a second sensing insulating layer 330 disposed on the first sensing conductive layer TCL1, and a second sensing conductive layer TCL2 disposed on the second sensing insulating layer 330. In an exemplary embodiment, the second sensing conductive layer TCL2 is disposed in the main region MR and the subsidiary region SR, and is not disposed in the bending region BR.

The first sensing insulating layer 310 may be disposed on the second inorganic encapsulation layer 116c. The first sensing insulating layer 310 may be disposed directly on the second inorganic encapsulation layer 116c. The first sensing insulating layer 310 may serve to isolate the first sensing conductive layer TCL1 from the plurality of conductive layers of the display member 20.

In an exemplary embodiment, the first sensing insulating layer 310 may include an inorganic insulating material. The inorganic material may include at least one of, for example, silicon oxide (SiOx), silicon nitride (SiNx), and silicon oxynitride (SiONx). In an exemplary embodiment, the first sensing insulating layer 310 may include an organic material. The organic material may include at least one of, for example, an acrylic resin, a methacrylic resin, a polyisoprene, a vinyl resin, an epoxy resin, a urethane resin, a cellulose resin, a siloxane resin, a polyimide resin, a polyamide resin, and a perylene resin.

The first sensing conductive layer TCL1 may be disposed on the first sensing insulating layer 310. The first sensing conductive layer TCL1 may include a first sensing bridge electrode CP1 for electrically connecting between adjacent ones of first sensing electrodes IE1_1 to IE1_8. The first sensing bridge electrodes CP1 may be spaced apart from each other. The first sensing bridge electrodes CP1 spaced apart from each other may partially expose the upper surface of the first sensing insulating layer 310. The first sensing bridge electrode CP1 of the first sensing conductive layer TCL1 may overlap with a black matrix (e.g., a light-blocking pattern BM, described below) and the bank 115, and thus, may be hidden from a viewer.

The second sensing insulating layer 330 may be disposed on the first sensing conductive layer TCL1. The second sensing insulating layer 330 may be in direct contact with the exposed upper surface of the first sensing insulating layer 310. The second sensing insulating layer 330 may serve to insulate the first sensing conductive layer TCL1 from the second sensing conductive layer TCL2. The second sensing insulating layer 330 may be made of an inorganic insulating material. The second sensing insulating layer 330 may include at least one of the above-listed materials of the first sensing insulating layer 310.

The second sensing conductive layer TCL2 may be disposed on the second sensing insulating layer 330. The second sensing conductive layer TCL2 may include the plurality of first sensing electrodes IE1_1 to IE1_8 and a plurality of second sensing electrodes IE2_1 to IE2_4, and may further include a second sensing bridge electrode CP2 for electrically connecting between adjacent ones of the second sensing electrodes IE2_1 to IE2_4.

The plurality of first sensing electrodes IE1_1 to IE1_8 may be extended in the second direction DR2 and may be arranged in the first direction DR1. The plurality of second sensing electrodes IE2_1 to IE2_4 may be extended in the first direction DR1 and may be arranged in the second direction DR2.

Each of the plurality of first sensing electrodes IE1-1 to IE1-8 may include a plurality of first sensing lines SPL1 having a mesh shape. The regions defined by the plurality of first sensing lines SPL1 may overlap the organic light-emitting layers 122_1 to 122_3 disposed in the pixels, respectively.

Each of the plurality of second sensing electrodes IE2-1 to IE2-4 may include a plurality of second sensing lines SPL2 having a mesh shape. The regions defined by the plurality of second sensing lines SPL2 may overlap the organic emission layers 122_1 to 122_3 disposed in the pixels, respectively. The regions defined by the plurality of first sensing lines SPL1 and the regions defined by the plurality of second sensing lines SPL2 may have, for example, a diamond shape. As used herein, the term "diamond shape" encompasses not only a substantially diamond shape, but also a simple geometric shape approximating a diamond shape depending on different processing conditions and the arrangement of the sensing lines.

The first sensing lines SPL1 are electrically insulated from the second sensing lines SPL2. In an exemplary embodiment, the plurality of first sensing lines SPL1 may be disposed on the same layer as the plurality of second sensing lines SPL2. In such a case, the plurality of first sensing bridge electrodes CP1 and the plurality of second sensing bridge electrodes CP2 are disposed in different layers, thereby being electrically insulated from each other.

The sensing bridge electrodes and the sensing electrodes of the second sensing conductive layer TCL2 may overlap with the black matrix and the bank 115, and thus, may be hidden from a viewer.

In exemplary embodiments, the electrodes of the first sensing conductive layer TCL1 described above may be disposed in the second sensing conductive layer TCL2, and vice versa.

In exemplary embodiments, the first sensing conductive layer TCL1 may include first sensing electrodes IE1_1 to IE1_8 and a first sensing bridge electrode CP1, and the second sensing conductive layer TCL2 may include second sensing electrode IE2_1 to IE2_4 and a second sensing bridge electrode CP2.

In exemplary embodiments, the first sensing conductive layer TCL1 may include second sensing electrodes IE2_1 to IE2_4 and a second sensing bridge electrode CP2, and the second sensing conductive layer TCL2 may include first sensing electrode IE1_1 to IE1_8 and a first sensing bridge electrode CPL.

Hereinafter, an example will be described in which the first sensing conductive layer TCL1 includes the first sensing bridge electrodes CP1 that electrically connect between adjacent ones of the first sensing electrodes IE1_1 to IE1_8, and the second sensing conductive layer TCL2 includes the first sensing electrodes IE1_1 to IE1_8 and the second sensing electrodes IE2_1 to IE2_4 as well as the second sensing bridge electrodes CP2 that electrically connect between the adjacent ones of the second sensing electrodes IE2_1 to IE2_4.

The second sensing conductive layer TCL2 may further include the first sensing connection electrode TCE1 to the third sensing connection electrode TCE3. The first sensing connection electrode TCE1 may be electrically connected to the source connection electrode SCE of the second conductive layer DCL2 through a first contact hole CNT1. The second sensing connection electrode TCE2 may be electrically connected to the source connection electrode SCE of the second conductive layer DCL2 through a third contact hole CNT3. The third sensing connection electrode TCE3 may be electrically connected to the source connection electrode SCE of the second conductive layer DCL2 through a second contact hole CNT2 and a fourth contact hole CNT4.

Each of the first sensing conductive layer TCL1 and the second sensing conductive layer TCL2 may include a conductive material. The conductive material may include, for example, a low-resistance metal such as silver (Ag), aluminum (Al), chromium (Cr) and nickel (Ni), or a conductive nano material such as a silver nanowire and a carbon nanotube.

The polarizing member 40 may be disposed on the second sensing conductive layer TCL2 and the second sensing insulating layer 330. In an exemplary embodiment, the polarizing member 40 may be a polarizing film. The polarizing member 40 may include a polarizing layer 430 and a polarizing adhesive layer 410 disposed on the polarizing layer 430. The polarizing adhesive layer 410 may contain, for example, a polymer material that includes a silicone polymer, a urethane polymer, an SU polymer having silicone-urethane hybrid structure, an acrylic polymer, an isocyanate polymer, a polyvinyl alcohol polymer, a gelatin polymer, a vinyl polymer, a latex polymer, polyester polymer, water-based polyester polymer, etc.

The polarizing adhesive layer 410 may be in contact (e.g., direct contact) with the second sensing conductive layer TCL2 and the upper surface of the second sensing insulating layer 330 that is not covered by the second sensing conductive layer TCL2. Outside air or moisture may permeate into the exposed second sensing conductive layer TCL2, which may cause corrosion of the second sensing conductive layer TCL2. In this regard, in the display panel 10 according to an exemplary embodiment of the present disclosure, the polarizing member 40 is disposed in the main region MR and the polarizing adhesive layer 410 of the polarizing member 40 is in direct contact with the second sensing conductive layer TCL2, thereby protecting the second sensing conductive layer TCL2. Therefore, corrosion of the second sensing conductive layer TCL2 which may be caused due to permeation of outside air or moisture may be prevented according to exemplary embodiments of the present disclosure.

As shown in FIG. 4, in an exemplary embodiment, the first sensing conductive layer TCL1 is disposed between the first sensing insulating layer 310 and the second sensing insulating layer 330, and the second sensing conductive layer TCL2 is disposed between the second sensing insulating layer 330 and the polarizing adhesive layer 410. The polarizing adhesive layer 410 directly contacts the second sensing conductive layer TCL2.

Referring to FIG. 5, the sensing member 30 may further include a second signal line SL2 and a third signal line SL3 that are connected to the first sensing electrodes IE1_1 to IE1_8 and the second sensing electrodes IE2_1 to IE2_4 and pass through the first pad area PA1 and the second pad area PA2. The display member 20 may include a first signal line SL that is connected to each of pixels in the display area and passes through the first and second pad areas PA1 and PA2.

The second signal line SL2 may be electrically connected to the second sensing electrodes IE2_1 to IE2_4 of the sensing member 30. The first signal line SL may be electrically connected to the first sensing electrodes IE1_1 to IE1_8 of the sensing member 30. Each of the first signal line SL to the third signal line SL3 may be extended across the main region MR, the bending region BR and the subsidiary region SR.

Referring to FIG. 6, the first signal line SL may include the source connection electrode SCE of the second conductive layer DCL2 and the third sensing connection electrode TCE3 that is electrically connected to the source connection electrode SCE through a fifth contact hole CNT5.

The second signal line SL2 may include the second sensing connection electrode TCE2 electrically connected to the second sensing electrodes IE2_1 to IE2_4 of the sensing member 30, the source connection electrode SCE electrically connected to the second sensing connection electrode TCE2 through the first contact hole CNT1, and the third sensing connection electrode TCE3 electrically connected to the source connection electrode SCE through the second contact hole CNT2.

The third signal line SL3 may include the first sensing connection electrode TCE1 electrically connected to the first sensing electrodes IE1_1 to IE1_8 of the sensing member 30, the source connection electrode SCE electrically connected to the first sensing connection electrode TCE1 through the third contact hole CNT3, and the third sensing connection electrode TCE3 electrically connected to the source connection electrode SCE through the fourth contact hole CNT4.

The first contact hole CNT1 and the third contact hole CNT3 may be located in the main region MR, and the second contact hole CNT2, the fourth contact hole CNT4 and the fifth contact hole CNT5 may be located in the subsidiary region SR.

Referring to FIG. 7, one side surface of the polarizing layer 430 and one side surface of the polarizing adhesive layer 410 of the polarizing member 40 may be aligned in the thickness direction. The polarizing member 40 may substantially cover and protect the upper surface of the first sensing connection electrode TCE1. The polarizing member 40 may expose a part of the upper surface of the first sensing connection electrode TCE1.

The cover film 60 may substantially cover the upper surface of the third sensing connection electrode TCE3, thereby protecting the third sensing connection electrode TCE3. The cover film 60 may expose a part of the upper surface of the third sensing connection electrode TCE3.

The cover film 60 may include a cover film layer and a cover adhesive layer disposed on the cover film layer. The cover film layer may be made of a material including at least one of, for example, polyethylene terephthalate (PET), polyimide (PI), polycarbonate (PC), polyethylene (PE), polypropylene (PP), polysulfone (PSF), polymethylmethacrylate (PMMA), triacetylcellulose (TAC) and cycloolefin polymer (COP). The cover adhesive layer can be used to attach the cover film layer to the sensing member 30. The cover adhesive layer may contain a polymer material that includes, for example, a silicone polymer, a urethane polymer, an SU polymer having silicone-urethane hybrid structure, an acrylic polymer, an isocyanate polymer, a polyvinyl alcohol polymer, a gelatin polymer, a vinyl polymer, a latex polymer, polyester polymer, water-based polyester polymer, etc.

The cover film 60 may cover and protect the second sensing conductive layer TCL2 exposed in the subsidiary region SR.

In exemplary embodiments, the inorganic layers of the display member 20 are not disposed in the bending region BR. For example, the buffer layer 111, the gate insulating layer 112 and the interlayer dielectric layer 113 of the display member 20 may include an opening in the bending region BR via which the upper surface of the substrate 101 is exposed. A via layer VIA may be disposed in the bending region BR of the substrate 101. The via layer VIA may include an organic insulating material. The via layer VIA may include at least one of the above-listed materials of the protective layer 114. The via layer VIA may be in contact with the exposed side surfaces of the buffer layer 111, the gate insulating layer 112, etc.

The source connection electrode SCE of the second conductive layer DCL2 described above may be disposed on the via layer VIA in the bending region BR. The source connection electrode SCE may be extended to the main region MR and a part of the subsidiary region SR. The source connection electrode SCE may be electrically connected to the first sensing connection electrode TCE1 and the third sensing connection electrode TCE3 through the first contact hole CNT1 and the second contact hole CNT2 in the main region MR and the subsidiary region SR, respectively. The first contact hole CNT1 and the second contact hole CNT2 may penetrate the encapsulation layer 116, the bank 115 and the protective layer 114 under the second sensing conductive layer TCL2, and may be electrically connected to the source connection electrode SCE of the second conductive layer DCL2.

The bending protective layer 50 may be disposed in the opening. The bending protective layer 50, which covers the bending region BR of the display panel 10, may protect the substrate 101 and may relieve bending stress when the display device 1 is bent.

The bending protective layer 50 may be in direct contact with the exposed side surfaces of the first sensing connection electrode TCE1 and the third sensing connection electrode TCE3 of the second sensing conductive layer TCL2. Moreover, the bending protective layer 50 may be disposed on the exposed upper surface of the first sensing connection electrode TCE1 and the third sensing connection electrode TCE3, thereby protecting the upper surface of the first sensing connection electrode TCE1 and the third sensing connection electrode TCE3 from outside air or moisture.

The bending protective layer 50 may made of a material including an organic insulating material. The organic insulating material may be, but is not limited to, an organic resin.

As described above, the side surface of the polarizing member 40 may be in contact (e.g., direct contact) with the side surface of the bending protective layer 50. For example, in exemplary embodiments, no spacing is formed between the side surface of the polarizing member 40 and the side surface of the bending protective layer 50. A more detailed description thereof will be made below with reference to FIGS. 11 and 12.

As described above, the third signal line SL3 may include the first sensing connection electrode TCE1 and the third sensing connection electrode TCE3. As shown in FIG. 7, exposed side surfaces of the first sensing connection electrode TCE1 and the third sensing connection electrode TCE3 are in direct contact with the bending protective layer 50.

Referring to FIG. 8, the polarizing member 40 may substantially cover and protect the upper surface of the second sensing connection electrode TCE2. The polarizing member 40 may expose a part of the upper surface of the second sensing connection electrode TCE2.

The source connection electrode SCE may be electrically connected to the second sensing connection electrode TCE2 and the third sensing connection electrode TCE3 through the third contact hole CNT3 and the fourth contact hole CNT4 in the main region MR and the subsidiary region SR, respectively. The second contact hole CNT2 and the fourth contact hole CNT4 may penetrate the encapsulation layer 116, the bank 115 and the protective layer 114 under the second sensing conductive layer TCL2, and may be electrically connected to the source connection electrode SCE of the second conductive layer DCL2. As described above, the second signal line SL2 may include the second sensing connection electrode TCE2. As shown in FIG. 8, an exposed side surface of the second sensing connection electrode TCE2 is in direct contact with the bending protective layer 50.

Referring to FIG. 9, unlike as shown in FIGS. 7 and 8, the source connection electrode SCE of the second conductive layer DCL2 may be extended from the display area of the main area MR to the bending region BR and a part of the subsidiary region SR. The source connection electrode SCE may be electrically connected to the third sensing connection electrode TCE3 through the fifth contact hole CNT5 in the subsidiary region SR. The fifth contact hole CNT5 may penetrate the encapsulation layer 116, the bank 115 and the protective layer 114 under the second sensing conductive layer TCL2, and may be electrically connected to the source connection electrode SCE of the second conductive layer DCL2.

Referring to FIG. 10, the polarizing adhesive layer 410 of the polarizing member 40 may cover the upper surface and the side surfaces of each of the second sensing connection electrode TCE2 and the first sensing connection electrode TCE1. For example, the polarizing adhesive layer 410 may cover the upper surface and the side surfaces of each of the second sensing connection electrode TCE2 and the first sensing connection electrode TCE1.

According to an exemplary embodiment of the present disclosure, the thickness of the display device 1 can be reduced by disposing the second sensing conductive layer at the top of the sensing member 30 and eliminating a protective layer covering the second sensing conductive layer, such as an organic layer, as described above.

In addition, as previously described, in a comparative example, outside air or moisture may permeate into the second sensing conductive layer TCL2 when the second sensing conductive layer TCL2 is exposed, which may corrode and damage the second sensing conductive layer TCL2. To prevent this, in the display panel 10 according to an exemplary embodiment of the present disclosure, the polarizing member 40 is disposed in the main region MR, the bending protective layer 50 is disposed in the bending region BR, and the cover film 60 is disposed in the subsidiary region SR, thereby covering and protecting the exposed second sensing conductive layer TCL2. In this manner, exemplary embodiments may prevent the second sensing conductive layer TCL2 from being exposed to outside air or moisture, and thus, may prevent corrosion.

However, it is desirable that no spacing is formed between the polarizing member 40 and the bending protective layer 50 in order to cover and protect the second sensing conductive layer TCL2. To this end, the bending protective layer 50 may be formed by depositing the constituent materials of the bending protective layer 50 up to a part of the upper surface of the polarizing member 40 after the polarizing member 40 is attached. This will be described with reference to FIGS. 11 and 12.

Figure 11:
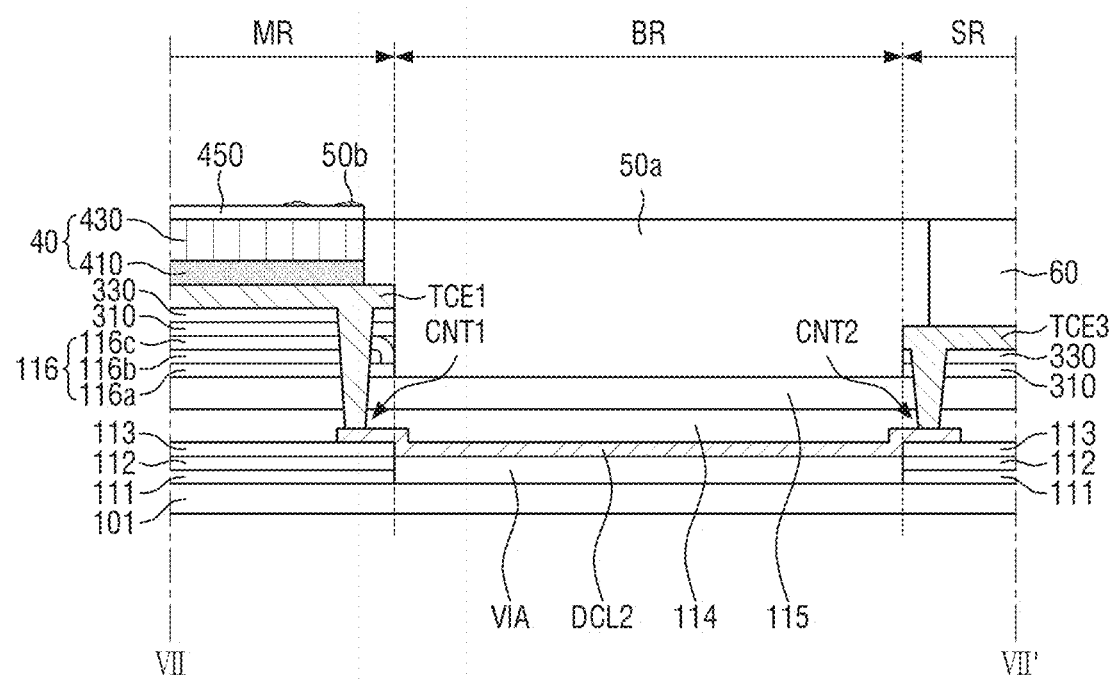
FIGS. 11 and 12 are cross-sectional views illustrating process steps for forming a bending protective layer according to an exemplary embodiment of the present disclosure.
Figure 12:
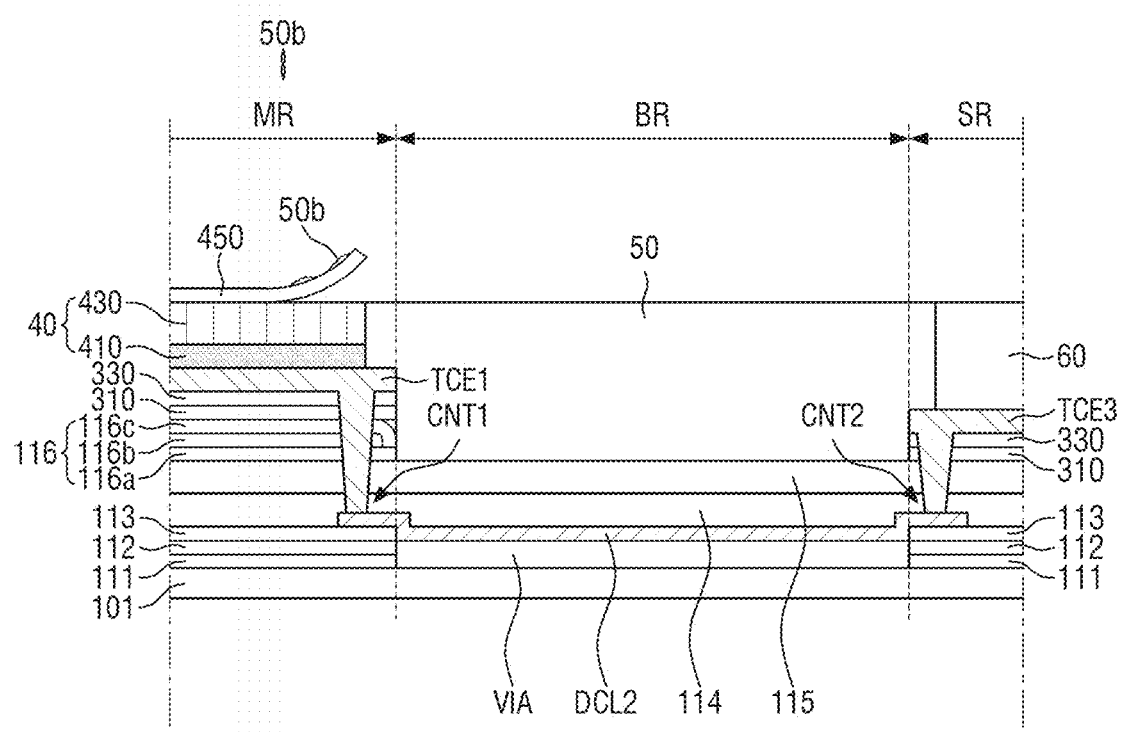

FIGS. 11 and 12 are cross-sectional views illustrating process steps for forming a bending protective layer according to an exemplary embodiment of the present disclosure.

Referring to FIG. 11, after the polarizing member 40 is attached, an organic material layer 50a is formed in the bending region BR, the main region MR and a part of the subsidiary region SR. The organic material layer 50a may be formed by, for example, slit coating, spin coating, etc. The organic material layer 50a is formed such that it is in contact with the side surface of the polarizing adhesive layer 410 of the polarizing member 40, the side surface of the polarizing layer 430, and the upper surface and side surfaces of the first sensing connection electrode TCE1 of the second sensing conductive layer TCL2, etc. During the process of applying an organic material 50b to the side surface of the polarizing member 40, a part of the organic material 50b may be applied on the polarizing member 40 as well.

Referring to FIG. 12, a release film 450 disposed on the polarizing member 40 is peeled off and removed. In doing so, the organic material 50b on the polarizing member 40 is removed together with the release film 450, and thus, the bending protective layer 50 and its constituent material do not remain on the upper surface of the polarizing member 40 after it is formed. In addition, since the bending protective layer 50 is formed in contact (e.g., direct contact) with the entire side surface of the polarizing member 40 as described above, there is no spacing between the bending protective layer 50 and the polarizing member 40. Accordingly, the second sensing conductive layer TCL2 is not exposed to outside air or moisture, and thus, the second sensing conductive layer TCL2 may be prevented from being corroded.

Hereinafter, display devices according to exemplary embodiments of the present disclosure will be described. In the following description, the same or similar elements will be denoted by the same or similar reference numerals. For convenience of explanation, a further description of the same or similar elements previously described may be omitted or only briefly described.

Figure 13:
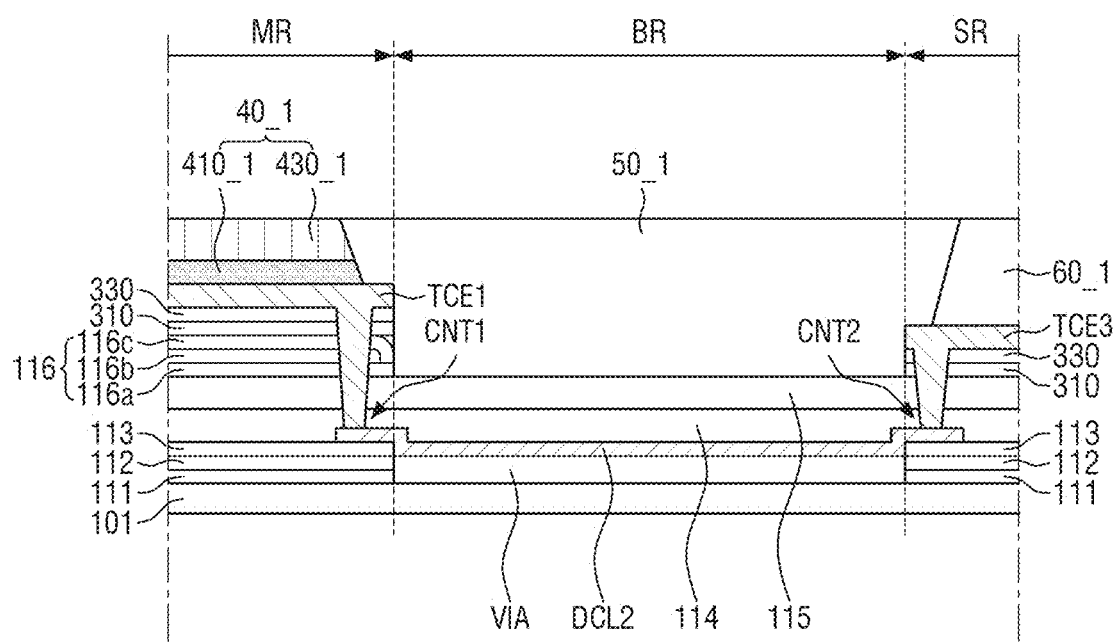
FIG. 13 is a cross-sectional view of a display panel according to an exemplary embodiment of the present disclosure.

FIG. 13 is a cross-sectional view of a display panel according to an exemplary embodiment of the present disclosure.

A display panel 11 according to an exemplary embodiment as shown in FIG. 13 is substantially identical to the display panel 10 according to the above-described exemplary embodiment, except that a side surface of a polarizing member 40_1 and a side surface of a cover film 60_1 are asymmetrical in the thickness direction, and a side surface of a bending protective layer 50_1 in contact with the side surfaces is also asymmetrical in the thickness direction.

For example, the side surface of the polarizing member 40_1 and the side surface of the cover film 60_1 have an asymmetric shape in the thickness direction, and the side surface of the bending protective layer 50_1 in contact with the side surfaces may also have an asymmetric shape in the thickness direction. The side surface of the polarizing member 40_1 and the side surface of the cover film 601 may be inclined at an acute angle. For example, the side surface of the polarizing adhesive layer 410_1 and the side surface of the polarizing layer 430_1 of the polarizing member 40_1 may be inclined in the thickness direction. The side surface of the bending protective layer 50_1 in contact with the side surface of the polarizing member 40_1 and the side surface of the cover film 60_1 may be inclined at an obtuse angle. The sum of the inclination angle of the side surface of the polarizing member 40_1 and the inclination angle of the side surface of the bending protective layer 50_1 may be equal to about 180 degrees.

The side surface of the polarizing member 40_1 and the side surface of the bending protective layer 50_1 may partially overlap each other in the thickness direction. For example, since the side surface of the polarizing member 40_1 and the side surface of the bending protective layer 501 partially overlap with each other, the possibility that spacing is formed between the polarizing member 40_1 and the bending protective layer 50_1 can be reduced. Further, even if some spacing is formed therebetween, permeation of outside air or moisture may be reduced due to the side surfaces overlapping each other.

Figure 14:
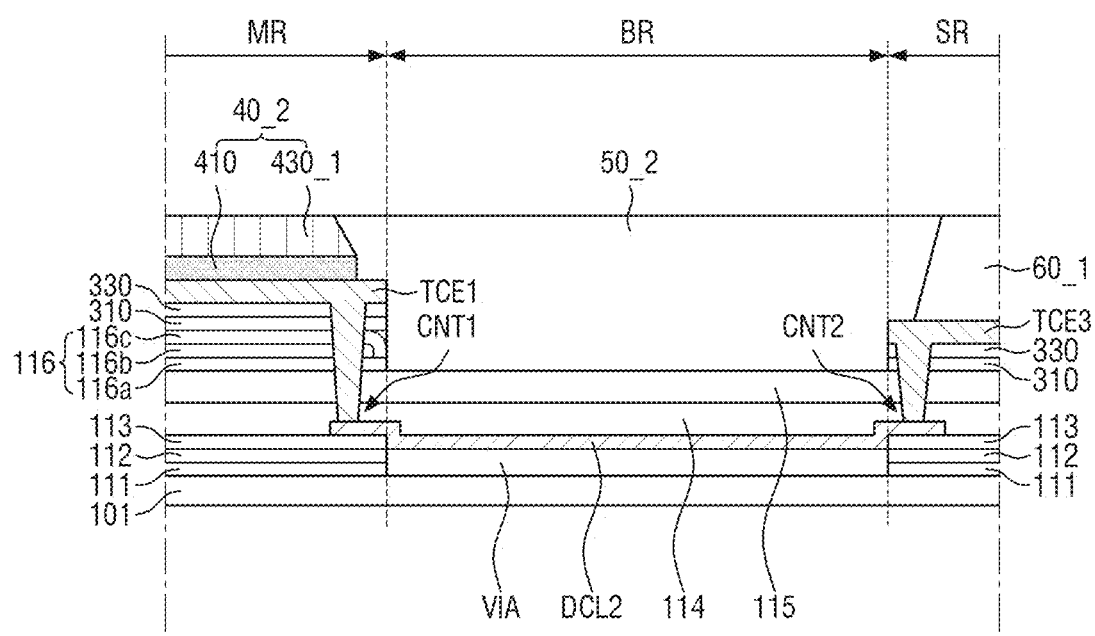
FIG. 14 is a cross-sectional view of a display panel according to an exemplary embodiment of the present disclosure.

FIG. 14 is a cross-sectional view of a display panel according to an exemplary embodiment of the present disclosure.

A display panel 12 according to an exemplary embodiment as shown in FIG. 14 is substantially identical to the display panel 11 shown in FIG. 13, except that a side surface of a polarizing layer 430_1 of a polarizing member 40_2 is asymmetrical in the thickness direction, whereas a side surface of a polarizing adhesive layer 410 is symmetrical in thickness direction. For example, the side surface of the polarizing layer 430_1 may be inclined in the thickness direction, and the side surface of the polarizing adhesive layer 410 may be substantially straight in the thickness direction. A side surface of the bending protective layer 502 may be in contact with the side surface of the polarizing layer 430_1 and the side surface of the polarizing adhesive layer 410, and a side surface of the bending protective layer 502 may be in contact with a side surface of the cover film 60_1.

For convenience of explanation, elements already described above with respect to FIGS. 13 and 7 will not be described again.

Figure 15:
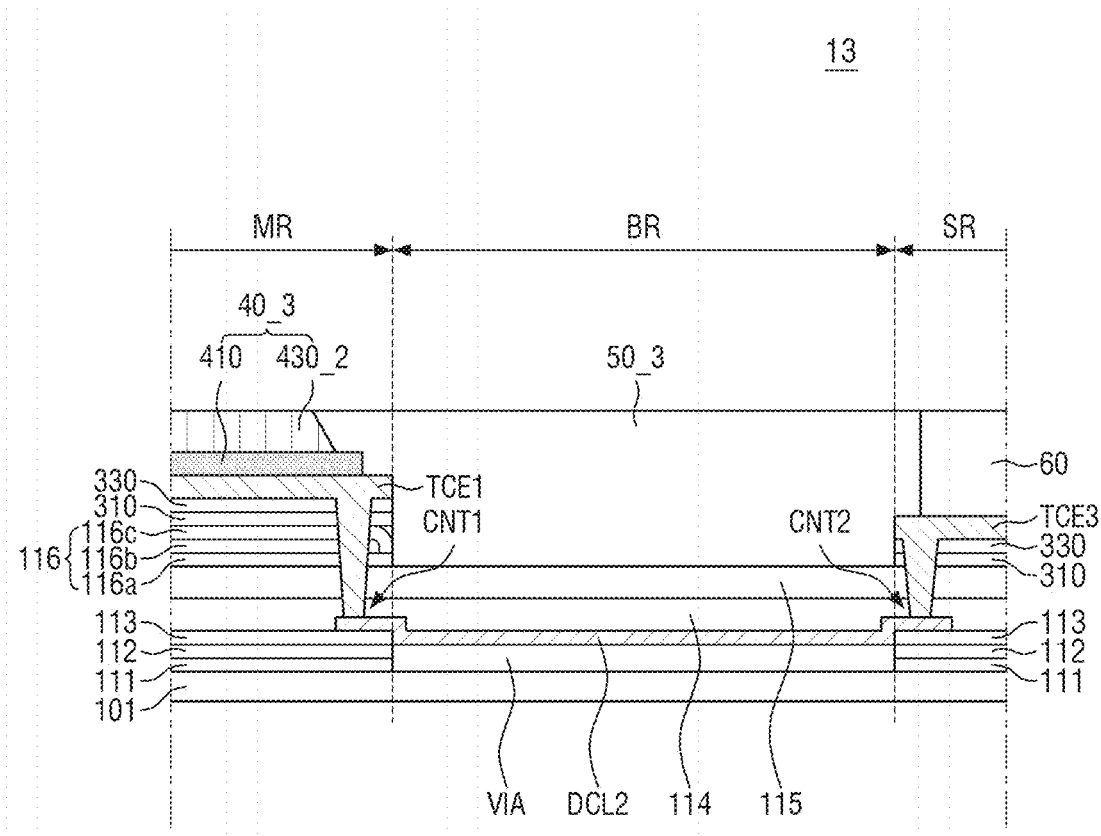
FIG. 15 is a cross-sectional view of a display panel according to an exemplary embodiment of the present disclosure.

FIG. 15 is a cross-sectional view of a display panel according to an exemplary embodiment of the present disclosure.

A display panel 13 according to an exemplary embodiment as shown in FIG. 15 is substantially identical to the display panel 12 shown in FIG. 14, except that a polarizing layer 430_2 is located more to the inside than a polarizing adhesive layer 410 toward the main region MR such that the upper surface of the polarizing adhesive layer 410 is partially exposed, and such that a bending protective layer 50_3 covers the exposed upper surface of the polarizing adhesive layer 410. For example, a distance between the polarizing layer 430_2 and the bending region BR may be greater than a distance between the polarizing adhesive layer 410 and the bending region BR.

For convenience of explanation, the elements already described above with respect to FIGS. 14 and 7 will not be described again.

Figure 16:
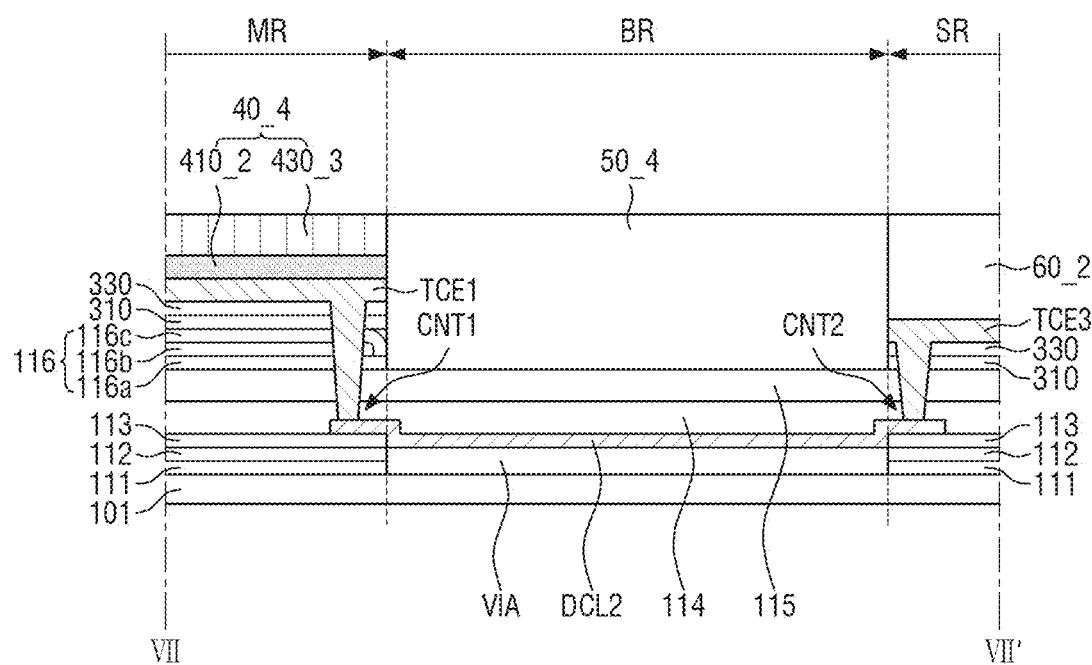
FIG. 16 is a cross-sectional view of a display panel according to an exemplary embodiment of the present disclosure.

FIG. 16 is a cross-sectional view of a display panel according to an exemplary embodiment of the present disclosure.

A display panel 14 according to an exemplary embodiment as shown in FIG. 16 is substantially identical to the display panel 10 described above, except that the boundary between a polarizing member 40_4 and a bending protective layer 504 is aligned with the boundary between the main region MR and the bending region BR, and that the boundary between the bending protective layer 50_4 and a cover film 60_2 is aligned with the boundary between the subsidiary region SR and the bending region BR. For example, a side surface of a polarizing adhesive layer 410_2 and a side surface of a polarizing layer 430_3 may be aligned at the boundary between the main region MR and the bending region BR.

For convenience of explanation, the elements already described above with respect to FIG. 7 will not be described again.

Hereinafter, a method for fabricating the display device 1 will be described. In the following description, the same or similar elements will be denoted by the same or similar reference numerals, and for convenience of explanation, redundant descriptions thereof will be omitted or only briefly described.

Figure 17:
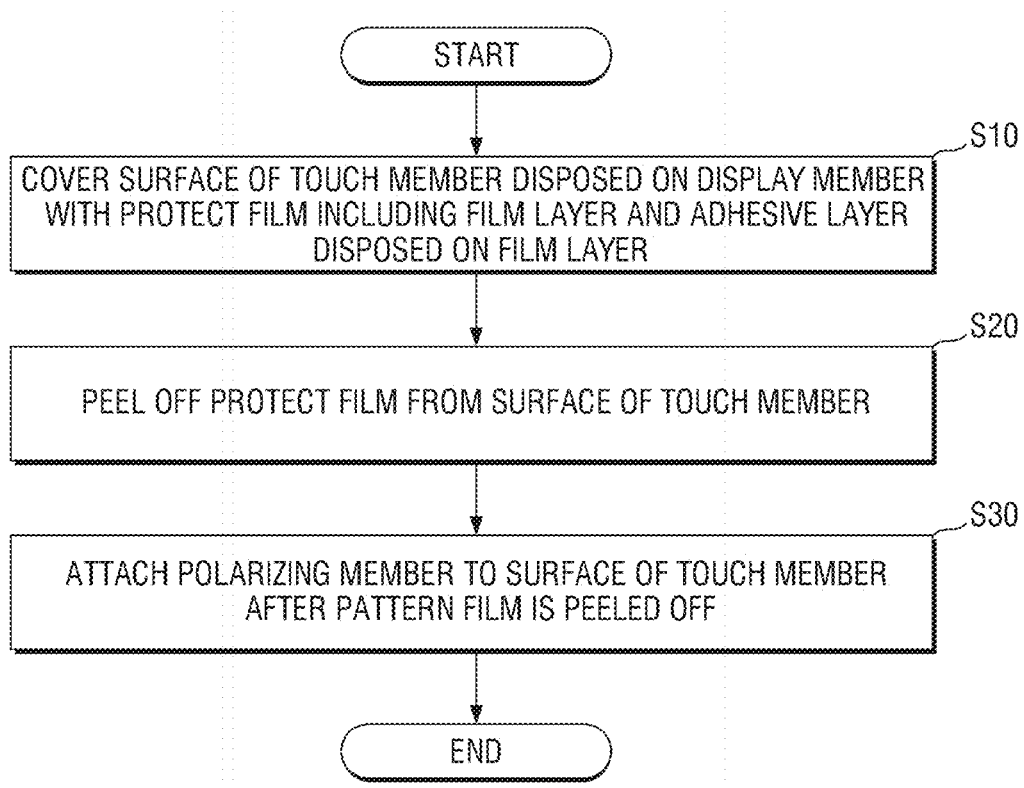
FIG. 17 is a flowchart illustrating a method for fabricating a display device according to an exemplary embodiment of the present disclosure.

FIG. 17 is a flowchart illustrating a method for fabricating a display device according to an exemplary embodiment of the present disclosure. FIGS. 18 to 21 are cross-sectional views showing processing steps of a method for fabricating a display device according to an exemplary embodiment of the present disclosure.

Referring to FIGS. 17 to 21, the display panel 10 may be referred to as a target panel. After the elements are stacked on a sub-substrate, the target panel may be chopped into cells via, for example, a cell cutting process.

Figure 18:
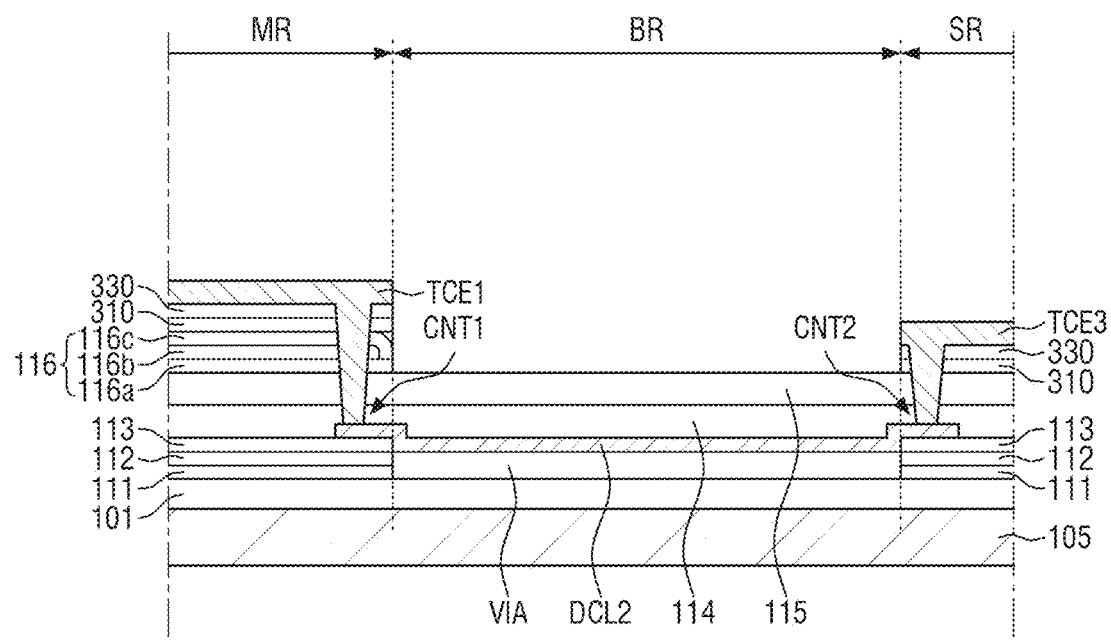
FIGS. 18 to 21 are cross-sectional views showing processing steps of a method of fabricating a display device according to an exemplary embodiment of the present disclosure.

Referring to FIGS. 17 and 18, a sub-substrate 105 is disposed under a substrate 101. The sub-substrate 105 may be disposed under the substrate 101 for fabricating the target panel including the substrate 101. The sub-substrate 105 may include a rigid material such as, for example, glass.

Figure 19:
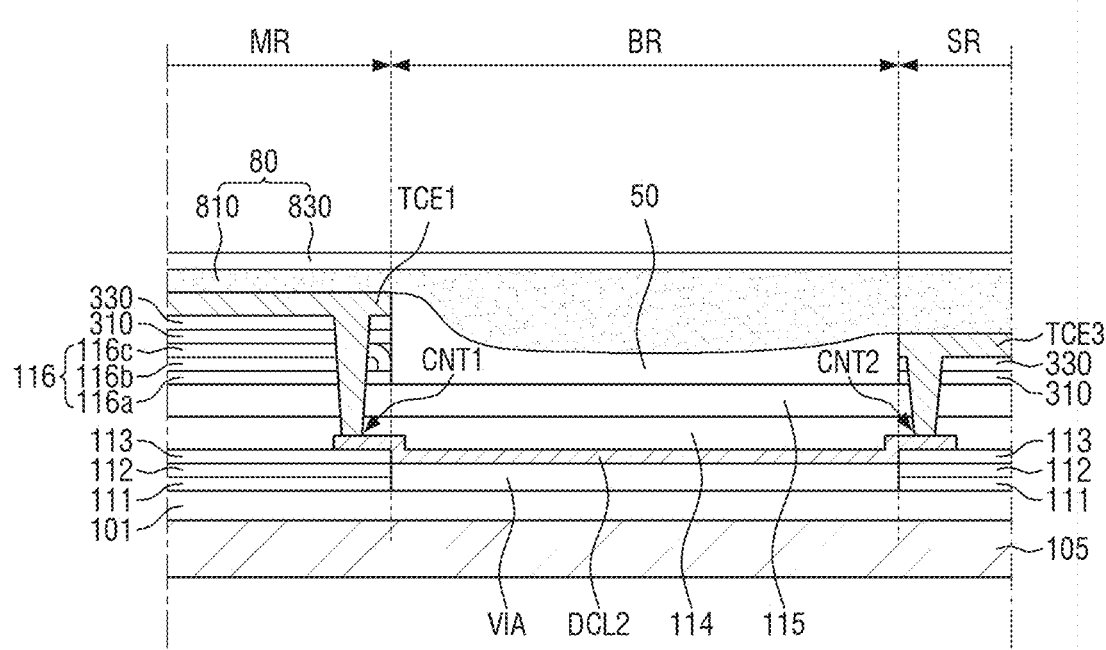

Referring to FIGS. 17 and 19, a protective film 80 is disposed on the sensing member 30 (operation S10). The protective film 80 may include a film layer 830 and an adhesive layer 810 disposed on the film layer 830. The protective film 80 may be disposed across the main region MR, the bending region BR and the subsidiary region SR. The sub-substrate 105 will be separated as described later. Then, the protective film 80 can support the target panel when a structure including a supporting plate including, for example, a rigid or semi-rigid material supporting the target panel is formed.

The adhesive layer 810 of the protective film 80 may be disposed in contact with the second sensing conductive layer TCL2. Further, the adhesive layer 810 may be disposed in direct contact with the second sensing insulating layer 330 not covered by the second sensing conductive layer TCL2. In an exemplary embodiment, the adhesive layer 810 may be an adhesive containing an inorganic material. For example, the adhesive layer 810 may be an adhesive containing a silicone-based inorganic material. Since the adhesive layer 810 is made of an adhesive containing an inorganic material, the adhesive layer 810 can be easily peeled off from the second sensing conductive layer TCL2 and the second sensing insulating layer 330 during the process of peeling the protective film 80, to be described later.

Figure 20:
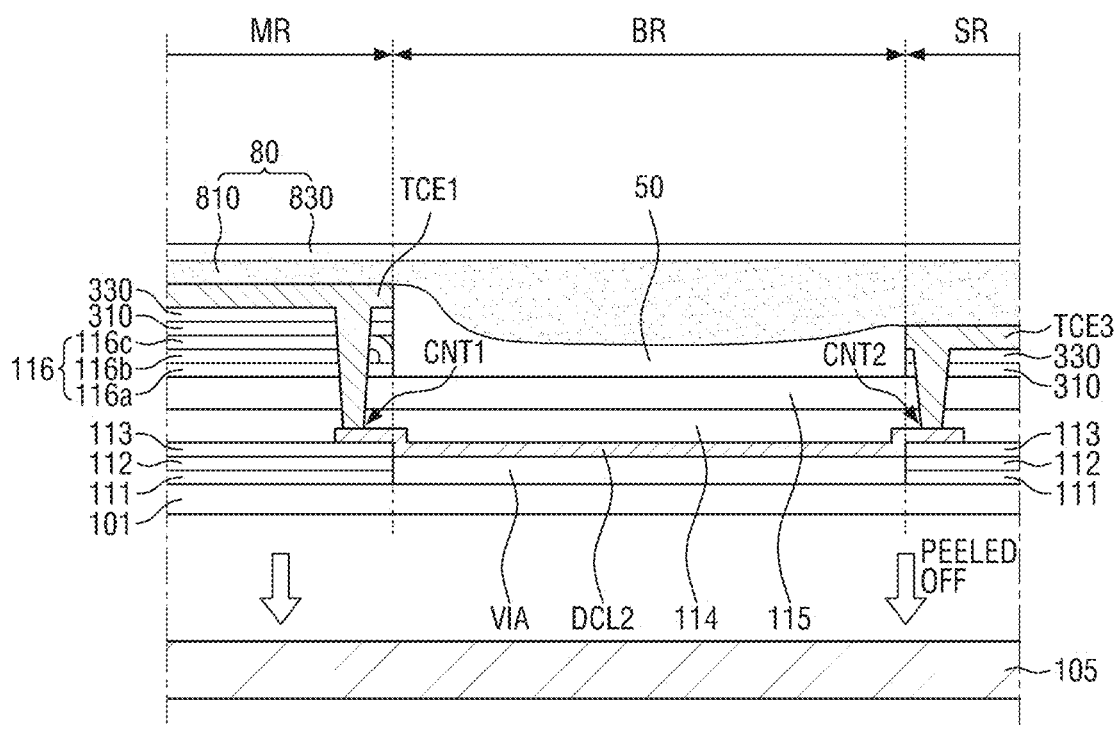

Subsequently, referring to FIGS. 17 and 20, the sub-substrate 105 is detached from the substrate 101, as described above. The process of detaching the sub-substrate 105 is carried out after the surface of the substrate 101 is irradiated with a laser by using, for example, a laser device or the like, so that the bonding force between the substrate 101 and the sub-substrate 105 becomes weak, thereby facilitating detachment.

Figure 21:
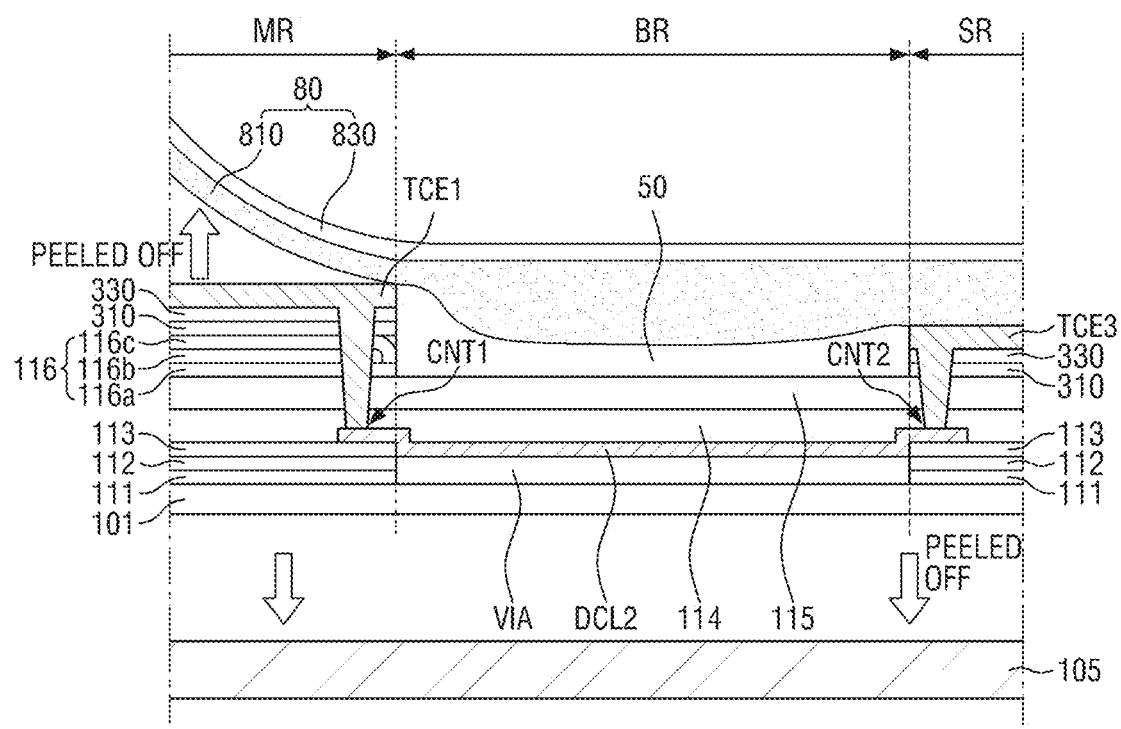

Subsequently, referring to FIGS. 17 and 21, the protective film 80 is peeled off from one surface of the sensing member 30 as described above (operation S20). For example, the protective film 80 may be peeled off from the second sensing conductive layer TCL2 and the second sensing insulating layer 330 not covered by the second sensing conductive layer TCL2. As described above, because the adhesive layer 810 is made of an adhesive containing an inorganic material, the process of peeling the protective film 80 can be easily carried out.

Subsequently, referring to FIG. 17, a polarizing member 40 is attached on the surface of the sensing member 30 from which the protective film 80 is peeled off (operation S30). A polarizing adhesive layer 410 of the polarizing member 40 is disposed in contact with the second sensing conductive layer TCL2 of the sensing member 30 and the second sensing insulating layer 330 not covered by the second sensing conductive layer TCL2.

Figure 22:
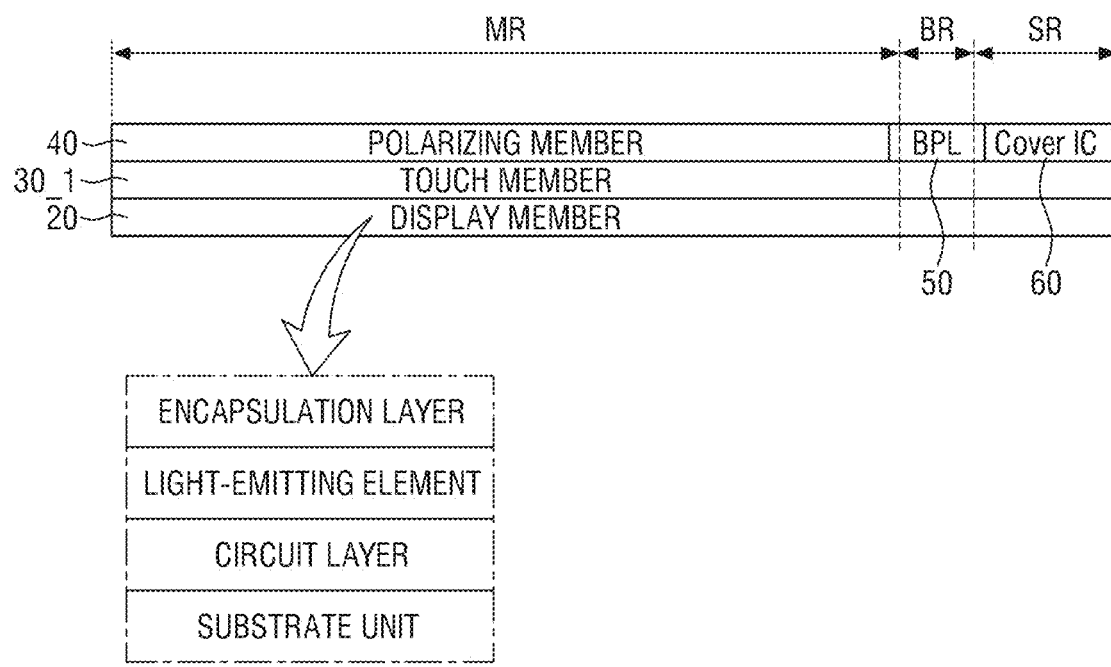
FIG. 22 is a cross-sectional view of a display device according to an exemplary embodiment of the present disclosure.
Figure 23:
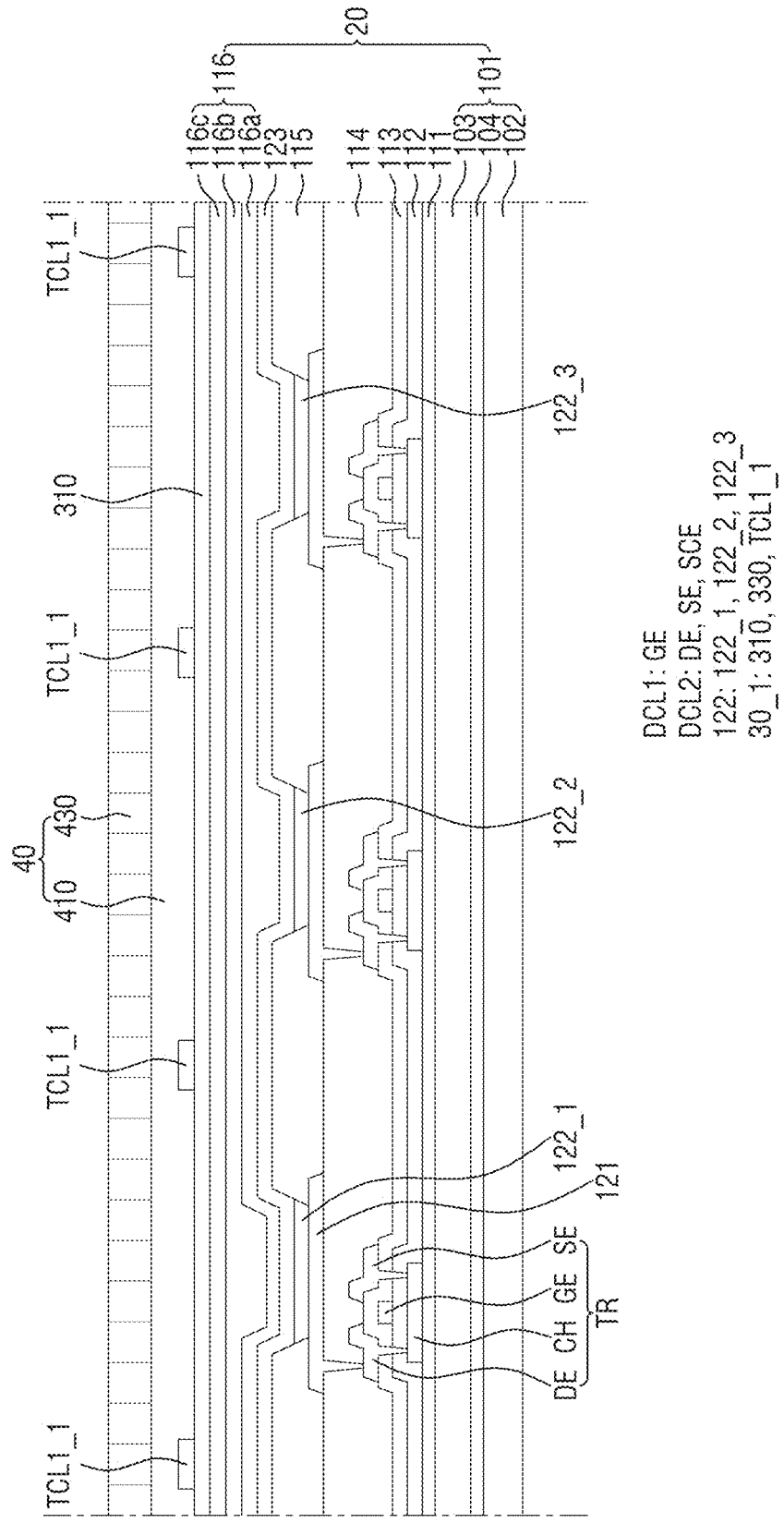
FIG. 23 is a cross-sectional view of a main region of a display device according to an exemplary embodiment of the present disclosure.
Figure 24:
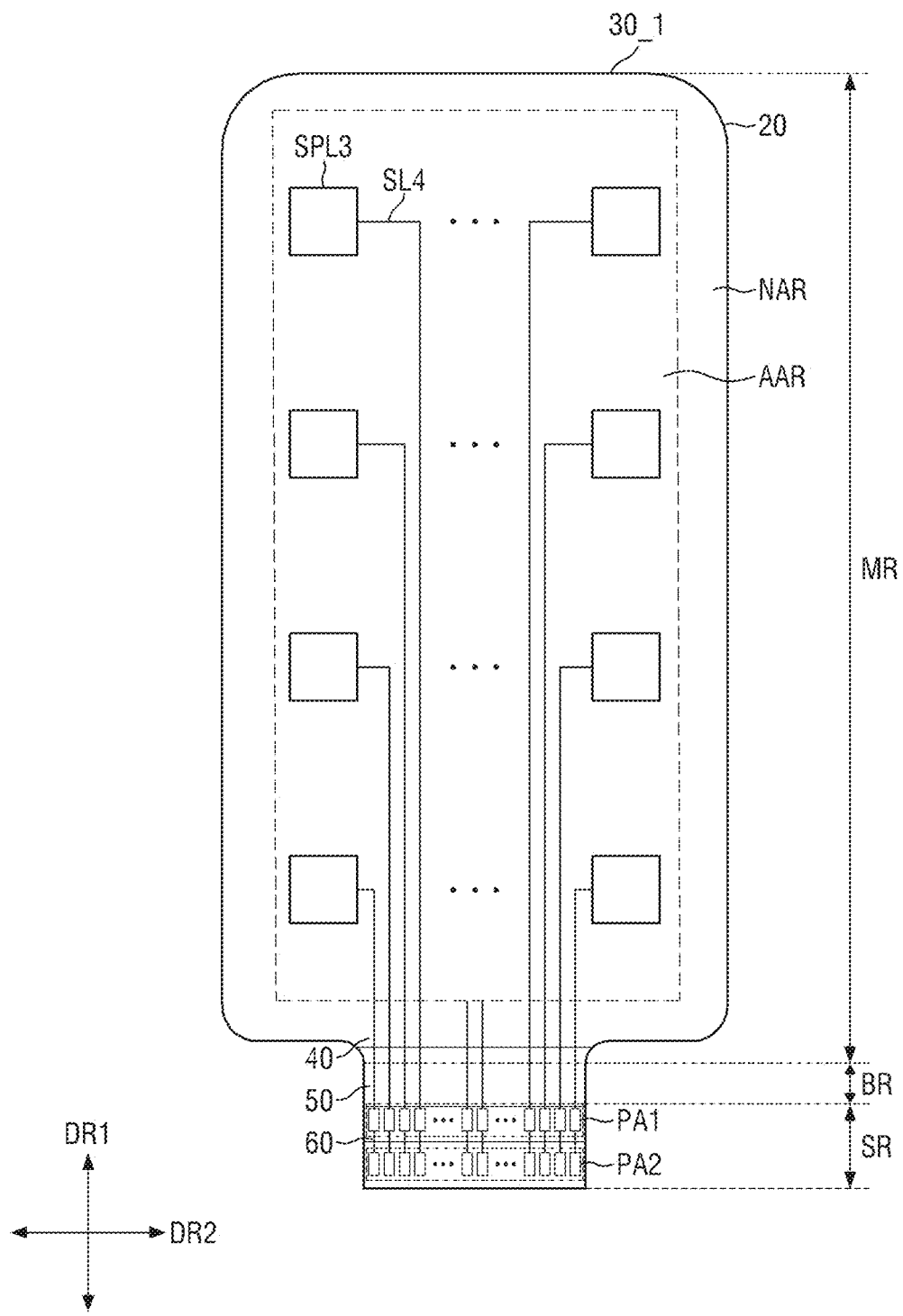
FIG. 24 is a plan view showing a layout of a display member and a sensing member of a display device according to an exemplary embodiment of the present disclosure.
Figure 25:
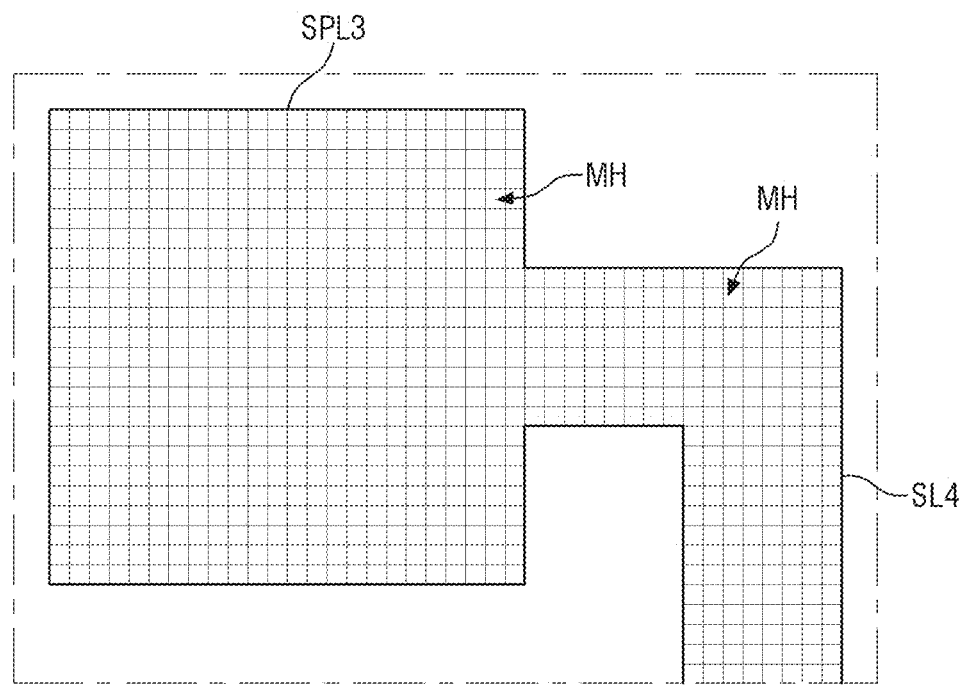
FIG. 25 is an enlarged plan view of a portion of the display device shown in FIG. 24.
Figure 26:
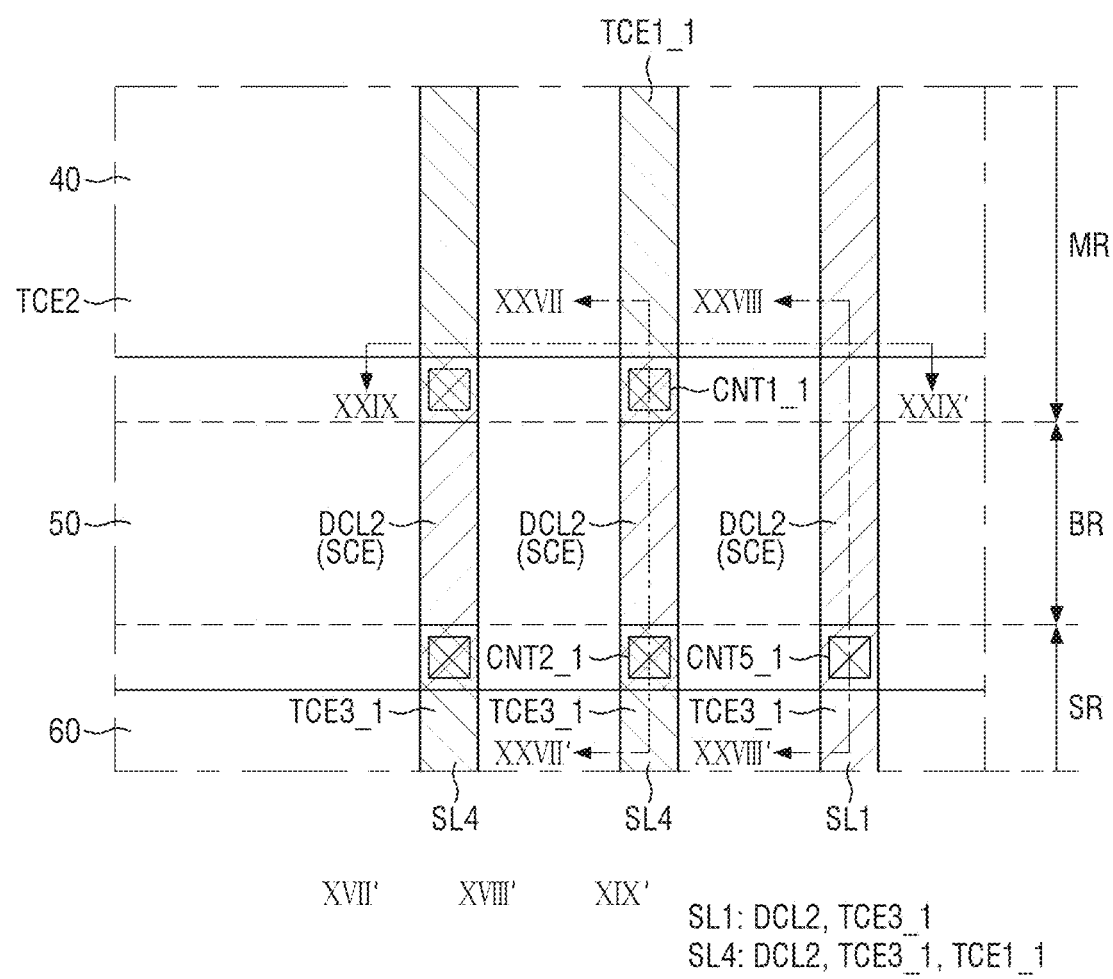
FIG. 26 is a view showing a layout of signal lines arranged in a main region, a bending region and a subsidiary region according to an exemplary embodiment.
Figure 27:
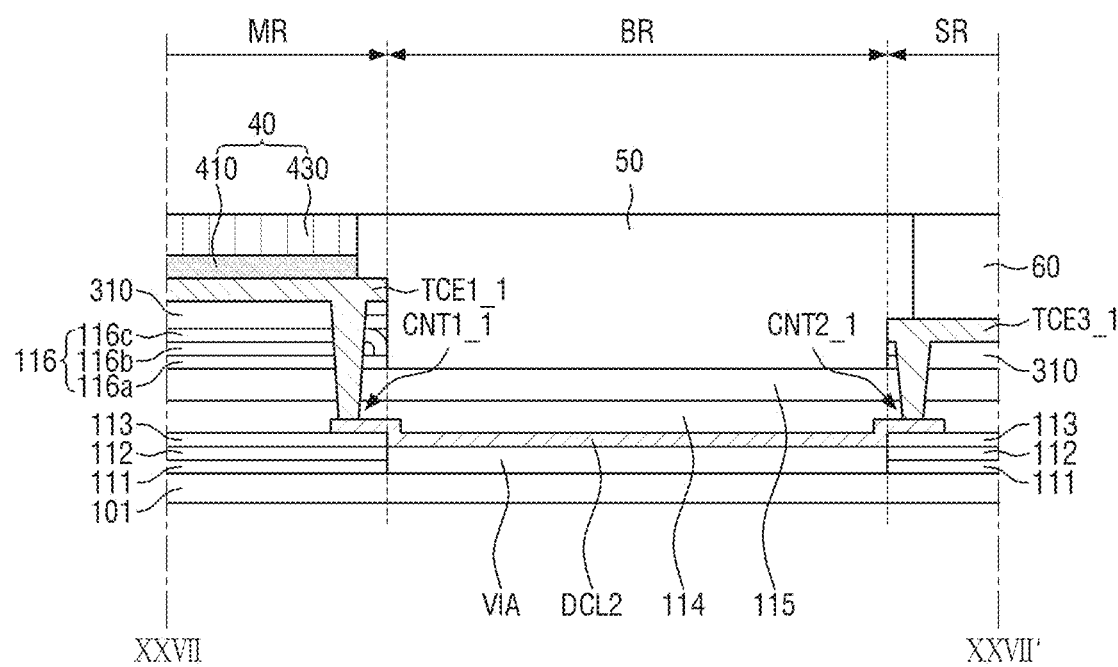
FIG. 27 is a cross-sectional view taken along line XXVII-XXVII' of FIG. 26.
Figure 28:
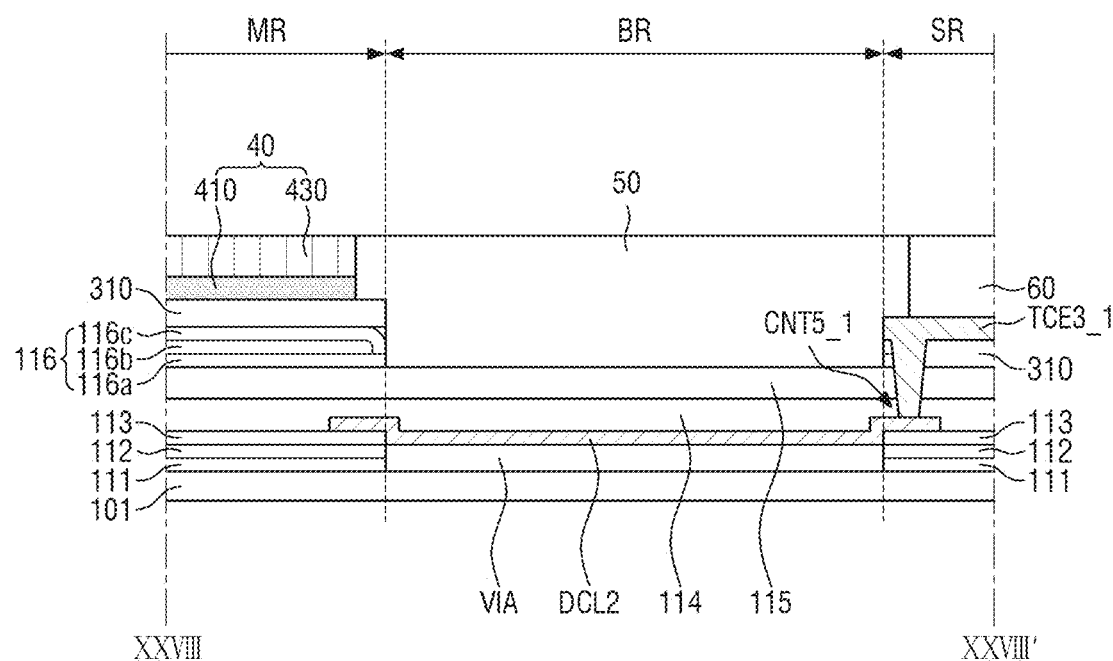
FIG. 28 is a cross-sectional view taken along line XXVIII-XXVIII' of FIG. 26.
Figure 29:
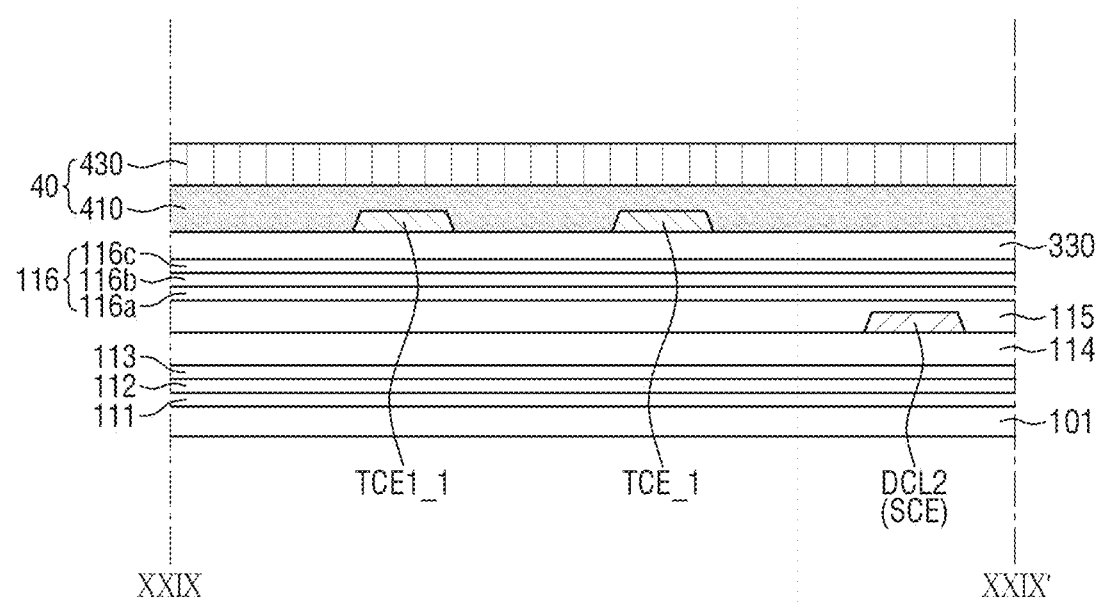
FIG. 29 is a cross-sectional view taken along line XXIX-XXIX' of FIG. 26.

FIG. 22 is a cross-sectional view of a display device according to an exemplary embodiment of the present disclosure. FIG. 23 is a cross-sectional view of a main region of a display device according to an exemplary embodiment of the present disclosure. FIG. 24 is a plan view showing a layout of a display member and a sensing member of a display device according to an exemplary embodiment of the present disclosure. FIG. 25 is an enlarged plan view of a portion of the display device shown in FIG. 24. FIG. 26 is a view showing a layout of signal lines arranged in a main region, a bending region and a subsidiary region according to an exemplary embodiment of the present disclosure. FIG. 27 is a cross-sectional view taken along line XXVII-XXVII' of FIG. 26. FIG. 28 is a cross-sectional view taken along line XXVIII-XXVIII' of FIG. 26. FIG. 29 is a cross-sectional view taken along line XXIX-XXIX' of FIG. 26.

A sensing member 30_1 (also referred to as a touch member) according to an exemplary embodiment as shown in FIGS. 22 to 29 is substantially identical to the sensing member 30 described above, except that the sensing member 30_1 does not include the second sensing insulating layer 330 and the second sensing conductive layer TCL2.

Referring to FIG. 23, a polarizing adhesive layer 410 of a polarizing member 40 may be disposed directly on the upper surface of a first sensing conductive layer TCL1_1. For example, the polarizing adhesive layer 410 may be in direct contact with the first sensing conductive layer TCL1_1. The polarizing adhesive layer 410 may also be in contact with the upper surface of a first sensing insulating layer 310 not covered by the first sensing conductive layer TCL1_1.

Referring to FIGS. 24 and 25, the sensing member 30_1 according to an exemplary embodiment of the present disclosure may include a plurality of sensing line portions SPL3. The sensing line portions SPL3 may be arranged in a matrix. For example, the sensing line portions SPL3 may be arranged along the first direction DR1 and the second direction DR2. The sensing line portions SPL3 may be formed in a rectangular shape, but the present disclosure is not limited thereto. In exemplary embodiments, the sensing line portions SPL3 may have various shapes such as, for example, a polygonal shape and a circular shape. Further, in exemplary embodiments, the sensing line portions SPL3 may have two or more shapes. For example, some of the sensing line portions SPL3 may have a rectangular shape, and others of the sensing line portions SPL3 may have a circular shape. Further, in exemplary embodiments, the sensing line portions SPL3 may have different areas. For example, when a hole for inserting a camera or the like is formed in the display device 1, the sensing line portions SPL3 around the hole may have a shape in which a part thereof is removed along the shape of the hole.

The sensing line portions SPL3 may be formed in an island shape and spaced apart from one another. The shape, size, and/or arrangement of the sensing line portions SPL3 are not particularly limited herein. The sensing line portions SPL3 may receive a driving signal for detecting a sensing operation. In addition, the sensing line portions SPL3 may output a sensing signal for detecting a sensing operation through fourth signal lines SL4.

The sensing line portions SPL3 may overlap with at least one electrode provided in the display member 20. For example, when the display member 20 is an organic light-emitting diode display panel, the sensing line portions SPL3 may overlap with the cathode electrode of the display member 20.

The sensing line portions SPL3 may form a first capacitance with one electrode provided in the display member 20. When a sensing operation is performed via at least one of the sensing line portions SPL3 using, for example, a user's finger, a second capacitance is generated between the finger and the sensing line portion SPL3, and the first capacitance changes due to the second capacitance. The changed value of the first capacitance is transmitted to a sensing detection unit through the fourth signal line SL4 connected to the sensing line portion SPL3 where the sensing operation was performed. The sensing detection unit may detect the sensing position based on the fourth signal line SL4 where the value of the first capacitance is received.

The sensing line portions SPL3 and the fourth signal lines SL4 may have a mesh structure for transmitting light output from the display area of the display member 20. For example, the sensing line portions SPL3 and the fourth signal lines SL4 may include a plurality of mesh holes MH, via which the first sensing insulating layer 310 is partially exposed. The mesh holes MH of the sensing line portion SPL3 and the fourth signal line SL4 may overlap the emission zone of the display member 20 in the thickness direction. Further, the area of the mesh holes MH may be made larger than the area of the emission zone of the display member 20. As the mesh holes MH are formed in the sensing line portions SPL3 and the fourth signal lines SL4, even though the sensing line portions SPL3 and the fourth signal lines SL4 are disposed in the display area of the display member 20, the light output from the display area of the display member 20 can transmit the sensing line portions SPL3 and the fourth signal lines SL4 to exit.

A sensing member 30_1 according to an exemplary embodiment as shown in FIGS. 26 to 29 is substantially identical to the sensing member 30 described above, except that a first sensing insulating layer 310 exposed by a first sensing conductive layer TCL_1 and a first sensing conductive layer TCL1_1 of the sensing member 30_1 may be in direct contact with a polarizing adhesive layer 410 of a polarizing member 40 thereon.

For example, referring to FIG. 26, a first signal line SL may include a source connection electrode SCE of a second conductive layer DCL2 and a third connection electrode TCE3_1 of a first sensing conductive layer TCL1_1. The third sensing connection electrode TCE31 may be electrically connected to the third sensing connection electrode TCE3_1 through a fifth contact hole CNT5_1. The fourth signal line SL4 may include the source connection electrode SCE of the second conductive layer DCL2, the first sensing connection electrode TCE1_1 and the third sensing connection electrode TCE3_1 of the first sensing conductive layer TCL1_1. The source connection electrode SCE of the fourth signal line SL4 is connected to the first sensing connection electrode TCE1_1 and the third sensing connection electrode TCE3_1 through the first contact hole CNT1_1 and the second contact hole CNT2_1, respectively.

The first contact hole CNT1_1 may be located in the main region MR, and the second contact hole CNT2_1 and the fifth contact hole CNT5_1 may be located in the subsidiary region SR.

Referring to FIG. 27, one side surface of the polarizing layer 430 and one side surface of the polarizing adhesive layer 410 of the polarizing member 40 may be aligned in the thickness direction. The polarizing member 40 can substantially cover and protect the upper surface of the first sensing connection electrode TCE1_1. The polarizing member 40 may expose apart of the upper surface of the first sensing connection electrode TCE1_1.

The cover film 60 may substantially cover the upper surface of the third sensing connection electrode TCE31 to protect it. The cover film 60 may expose a part of the upper surface of the third sensing connection electrode TCE3_1.

The cover film 60 may cover and protect the first sensing conductive layer TCL1_1 exposed in the subsidiary region SR.

The first contact hole CNT1_1 and the second contact hole CNT2_1 may penetrate the encapsulation layer 116, the bank 115 and the protective layer 114 under the first sensing conductive layer TCL1_1, and may be electrically connected to the source connection electrode SCE of the second conductive layer DCL2.

The bending protective layer 50 may be in contact with the exposed side surfaces of the first sensing connection electrode TCE1_1 and the third sensing connection electrode TCE3_1 of the first sensing conductive layer TCL1_1. Moreover, the bending protective layer 50 may be disposed on the exposed upper surface of the first sensing connection electrode TCE1_1 and the third sensing connection electrode TCE3_1 to protect the upper surface of the first sensing connection electrodes TCE1_1 and the third sensing connection electrodes TCE3_1 from outside air or moisture.

Referring to FIG. 28, the source connection electrode SCE may be electrically connected to the third sensing connection electrode TCE3_1 through a fifth contact hole CNT5_1 in the subsidiary region SR. The fifth contact hole CNT5_1 may penetrate the encapsulation layer 116, the bank 115 and the protective layer 114 under the first sensing conductive layer TCL1_1, and may be electrically connected to the source connection electrode SCE of the second conductive layer DCL2.

Referring to FIG. 29, the polarizing adhesive layer 410 of the polarizing member 40 may cover the upper surface and the side surfaces of the first sensing connection electrodes TCE1_1 spaced apart from one another. For example, the polarizing adhesive layer 410 may be in contact with the upper surface and the side surfaces of the first sensing connection electrodes TCE1_1.

According to an exemplary embodiment of the present disclosure, the thickness of the display device 1 can be reduced by disposing the first sensing conductive layer TCL1_1 at the top of the sensing member 30_1 and eliminating a protective layer covering the first sensing conductive layer TCL1_1 such as, for example, an organic layer, as described above.

Figure 30:
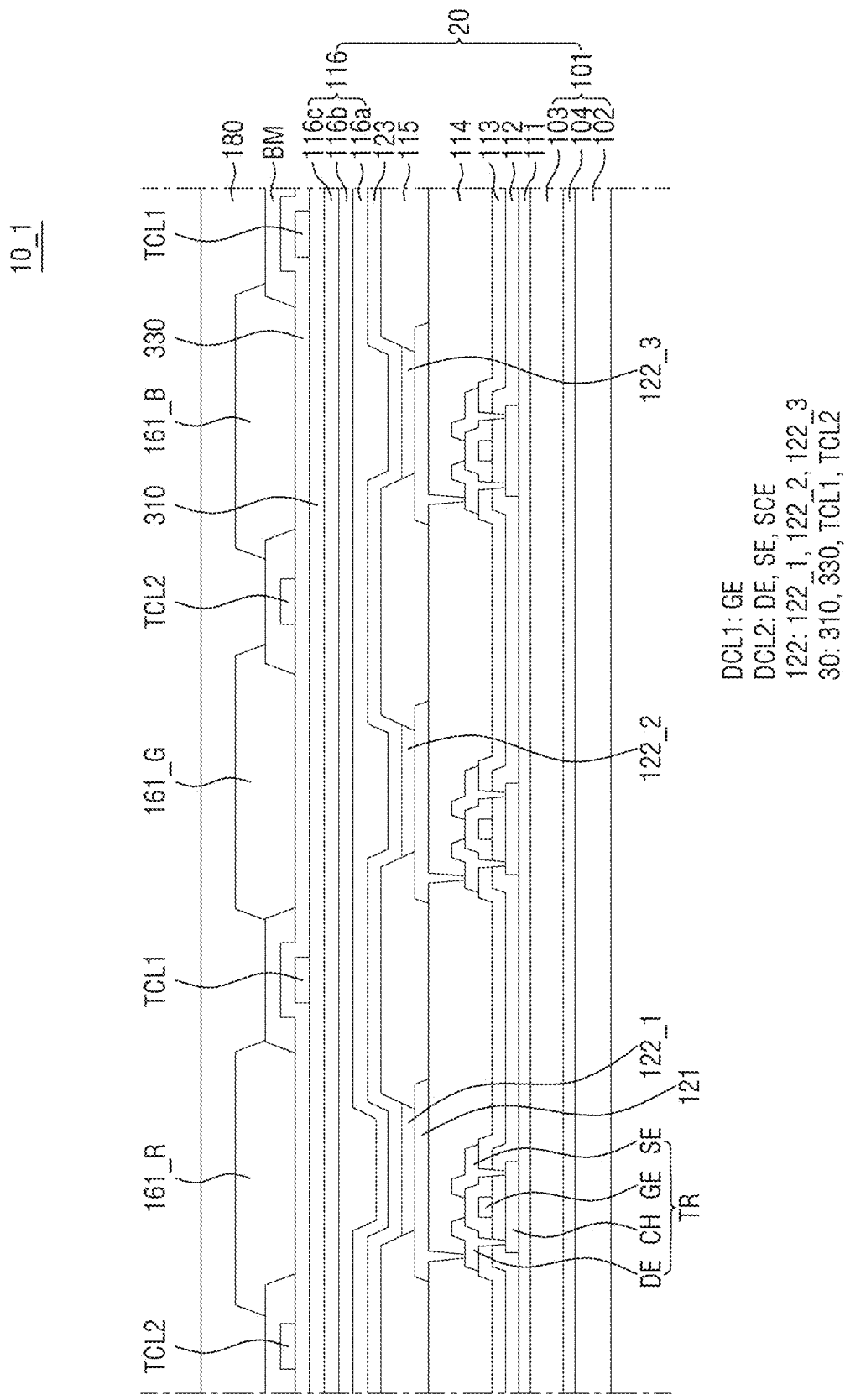
FIG. 30 is a cross-sectional view of a display panel according to an exemplary embodiment of the present disclosure.

FIG. 30 is a cross-sectional view of a display panel according to an exemplary embodiment of the present disclosure.

A display panel 10_1 according to an exemplary embodiment as shown in FIG. 30 is substantially identical to the display panel 10 described above, except that color filters 161_R, 161_G and 161_B, and a light-blocking pattern BM, are disposed in (and overlap) the main region MR in place of the polarizing member 40.

For example, the light-blocking pattern BM may be disposed on and in direct contact with the second sensing conductive layer TCL2. The sensing electrodes and the sensing bridge connection electrodes of the second sensing conductive layer TCL2 in the main region MR may be in contact with the light-blocking pattern BM. The light-blocking pattern BM may overlap the bank 115 thereunder in the thickness direction. The light-blocking pattern BM may be, for example, a black matrix (e.g., a light-blocking pattern BM, described below) and may include a photosensitive organic material.

Color filters 161_R, 161_G and 161_B may be disposed on the light-blocking pattern BM and the second sensing conductive layer TCL2 in each of the pixels. The color filters may include a red color filter 161_R transmitting red light and blocking green light and blue light, a green color filter 161_G transmitting green light and blocking red light and blue light, and a blue color filter 161_B transmitting blue light and blocking red light and green light. The color filters 161_R, 161_G and 161_B may include a photosensitive organic material. The light-blocking pattern BM may expose an upper surface of the second sensing insulating layer 330, and the color filters 161_R, 161_G and 161_B may be in direct contact with the exposed upper surface of the second sensing insulating layer 330.

The plurality of sensing electrodes and the sensing bridge connection electrodes of the second sensing conductive layer TCL2 may be disposed apart from one another as described above. Since the sensing electrodes and the sensing bridge connection electrodes are spaced apart from one another, the upper surface of the second sensing insulating layer 330 may be exposed partially. The color filters 161_R, 161_G and 161_B may be in contact with the exposed upper surface of the second sensing insulating layer 330.

An organic planarization layer 180 may be disposed on the color filters 161_R, 161_G and 161_B. The color filters 161_R, 161_G and 161_B may have level differences as shown in FIG. 30. The organic planarization layer 180 can provide a flat surface over the level differences. The organic planarization layer 180 may include an organic material.

The display panel according to an exemplary embodiment as shown in FIG. 30 is different from the display panel 10 in that the polarizing member 40 is eliminated in the main region MR, but the light-blocking pattern BM is disposed in the main region MR so that the sensing electrodes and the sensing bridge connection electrodes of the second sensing electrodes TCL2 exposed thereunder can be covered and protected.

While the present disclosure has been particularly shown and described with reference to the exemplary embodiments thereof, it will be understood by those of ordinary skill in the art that various changes in form and detail may be made therein without departing from the spirit and scope of the present disclosure as defined by the following claims.

What is claimed is:

1. A display device, comprising:
   a display member comprising a substrate and a plurality of light-emitting elements disposed on the substrate;
   a sensing member disposed on the display member; and
   a polarizing member disposed on the sensing member,
   wherein the sensing member comprises a sensing insulating layer and a sensing conductive layer disposed on the sensing insulating layer,
   wherein the polarizing member comprises a polarizing layer and a polarizing adhesive layer disposed between the polarizing layer and the sensing conductive layer,
   wherein the polarizing adhesive layer is in contact with the sensing conductive layer,
   wherein the substrate comprises a main region, a subsidiary region, and a bending region located between the main region and the subsidiary region,
   wherein a width of each of the subsidiary region and the bending region is less than a width of the main region in a plan view,
   wherein the polarizing member overlaps the main region, and does not overlap the bending region and the subsidiary region,
   wherein the sensing member overlaps the main region, the subsidiary region and the bending region, and
   wherein the sensing conductive layer is disposed in the subsidiary region.

2. The display device of claim 1, wherein the sensing insulating layer comprises a first sensing insulating layer and a second sensing insulating layer,
   wherein the sensing conductive layer comprises a first sensing conductive layer disposed between the first sensing insulating layer and the second sensing insulating layer, and a second sensing conductive layer disposed between the second sensing insulating layer and the polarizing adhesive layer, and
   wherein the second sensing conductive layer is in direct contact with the polarizing adhesive layer.

3. The display device of claim 2, wherein the second sensing conductive layer is disposed in the main region and the subsidiary region, and is not disposed in the bending region.

4. The display device of claim 3, further comprising:
   a bending protective layer overlapping the bending region, wherein the bending protective layer is in direct contact with an exposed side surface of the second sensing conductive layer.

5. The display device of claim 4, wherein a side surface of the bending protective layer is in contact with a side surface of the polarizing member with no spacing therebetween.

6. The display device of claim 4, wherein the sensing member comprises a sensing region and a non-sensing region disposed around the sensing region,
   wherein the sensing conductive layer comprises a sensing electrode disposed in the sensing region and a first sensing connection line connected to the sensing electrode and disposed in the non-sensing region, and
   wherein the first sensing connection line is disposed in the main region and an exposed side surface of the first sensing connection line is in contact with the bending protective layer.

7. The display device of claim 6, wherein the display member comprises a display connection line disposed on the substrate in an entirety of the bending region, in a part of the main region and in a part of the subsidiary region, and
   wherein the display connection line is electrically connected to the first sensing connection line.

8. The display device of claim 7, wherein the display connection line is electrically connected to the first sensing connection line through a first contact hole in the main region, and overlaps the bending protective layer in a thickness direction in the bending region.

9. The display device of claim 7, wherein the second sensing conductive layer further comprises a second sensing connection line disposed in the non-sensing region and in the subsidiary region,
   wherein the second sensing connection line is electrically connected to the display connection line, and
   wherein an exposed side surface of the second sensing connection line is in direct contact with the bending protective layer.

10. The display device of claim 9, wherein the second sensing connection line is in electrical contact with the display connection line through a contact hole in the subsidiary region.

11. The display device of claim 9, wherein the bending protective layer is extended to a part of the main region and a part of the subsidiary region, and is in contact with an upper surface of the first sensing connection line and the second sensing connection line.

12. The display device of claim 9, further comprising:
    a driving integrated circuit disposed in the subsidiary region,
    wherein the second sensing connection line forms a sensing pad, and the sensing pad is coupled to the driving integrated circuit.

13. The display device of claim 12, further comprising:
    a cover substrate disposed in the subsidiary region,
    wherein the cover substrate is in direct contact with the bending protective layer.

14. A display device, comprising:
    a display member comprising a substrate having a main region, a subsidiary region and a bending region located between the main region and the subsidiary region, and a plurality of light-emitting elements disposed on the substrate,
    wherein a width of each of the subsidiary region and the bending region is less than a width of the main region in a plan view;
    a sensing member disposed on the display member and overlapping the main region, the subsidiary region and the bending region; and
    a polarizing member disposed on the sensing member,
    wherein the sensing member comprises a first sensing insulating layer and a first sensing conductive layer disposed on the first sensing insulating layer,
    wherein the polarizing member comprises a polarizing adhesive layer and a polarizing layer disposed on the polarizing adhesive layer,
    wherein the polarizing adhesive layer is in contact with the first sensing conductive layer,
    wherein the polarizing member overlaps the main region, and does not overlap the bending region and the subsidiary region, and
    wherein the first sensing conductive layer is disposed in the main region and the subsidiary region, and is not disposed in the bending region.

15. The display device of claim 14, further comprising:
    a bending protective layer overlapping the bending region, wherein the bending protective layer is in direct contact with an exposed side surface of the first sensing conductive layer.

16. The display device of claim 15, wherein a side surface of the bending protective layer is in contact with a side surface of the polarizing member with no spacing therebetween.

17. The display device of claim 15, wherein the first sensing conductive layer comprises a plurality of sensing electrodes spaced apart from one another and a plurality of first sensing connection lines connected to the sensing electrodes,
wherein a first one of the first sensing connection lines is disposed in the main region, and an exposed side surface of the first one of the first sensing connection lines is in contact with the bending protective layer.

18. The display device of claim 17, wherein the display member comprises a display connection line disposed on the substrate in an entirety of the bending region, in a part of the main region and in a part of the subsidiary region, and
wherein the display connection line is electrically connected to the first one of the first sensing connection lines.

19. The display device of claim 18, wherein the display connection line is electrically connected to the one of the first sensing connection lines through a first contact hole in the main region, and overlaps the bending protective layer in a thickness direction in the bending region.

20. The display device of claim 18, wherein the first sensing conductive layer further comprises a second sensing connection line disposed in the subsidiary region,
wherein the second sensing connection line is electrically connected to the display connection line, and
wherein an exposed side surface of the second sensing connection line is in direct contact with the bending protective layer.

21. A display device, comprising:
a display member comprising a substrate having a main region, a subsidiary region and a bending region located between the main region and the subsidiary region, and a plurality of light-emitting elements disposed on the substrate,
wherein a width of each of the subsidiary region and the bending region is less than a width of the main region in a plan view;
a sensing member disposed on the display member and overlapping the main region, the subsidiary region and the bending region;
a light-blocking pattern and a color filter layer disposed on the sensing member and overlapping the main region,
wherein the sensing member comprises a first sensing insulating layer, a first sensing conductive layer disposed on the first sensing insulating layer, a second sensing insulating layer disposed on the first sensing conductive layer, and a second sensing conductive layer disposed on the second sensing insulating layer, and
wherein the light-blocking pattern is in direct contact with the second sensing conductive layer; and
a polarizing member disposed on the sensing member,
wherein the polarizing member overlaps the main region, and does not overlap the bending region and the subsidiary region, and
wherein the second sensing conductive layer is disposed in the subsidiary region.

22. The display device of claim 21, wherein the light-blocking pattern partially exposes an upper surface of the second sensing insulating layer, and the color filter layer is in direct contact with the exposed upper surface of the second sensing insulating layer.

23. A method for fabricating a display device, the method comprising:
covering a surface of a sensing member disposed on a display member with a protective film,
wherein the protective film comprises a film layer and an adhesive layer disposed on the film layer,
wherein the display member comprises a substrate having a main region, a subsidiary region and a bending region located between the main region and the subsidiary region, and
wherein a width of each of the subsidiary region and the bending region is less than a width of the main region in a plan view;
peeling off the protective film from the surface of the sensing member; and
attaching a polarizing member on the surface of the sensing member after the protective film is peeled off,
wherein the sensing member comprises a first sensing insulating layer, a first sensing conductive layer disposed on the first sensing insulating layer, a second sensing insulating layer disposed on the first sensing conductive layer, and a second sensing conductive layer disposed on the second sensing insulating layer,
wherein, after covering the surface of the sensing member with the protective film, the adhesive layer is in direct contact with the second sensing conductive layer,
wherein the polarizing member overlaps the main region, and does not overlap the bending region and the subsidiary region, and
wherein the second sensing conductive layer is disposed in the subsidiary region.

24. The method for claim 23, wherein the adhesive layer of the protective film comprises an inorganic adhesive material.

* * * * *